United States Patent
Mizukami et al.

(10) Patent No.: US 9,168,744 B2
(45) Date of Patent: Oct. 27, 2015

(54) ELECTROMECHANICAL TRANSDUCER ELEMENT, METHOD OF MANUFACTURING THE SAME, LIQUID DROPLET DISCHARGE HEAD, AND LIQUID DROPLET DISCHARGE DEVICE

(71) Applicants: Satoshi Mizukami, Kanagawa (JP); Takeshi Sano, Kanagawa (JP); Naoya Kondo, Kanagawa (JP); Masaki Kato, Tokyo (JP)

(72) Inventors: Satoshi Mizukami, Kanagawa (JP); Takeshi Sano, Kanagawa (JP); Naoya Kondo, Kanagawa (JP); Masaki Kato, Tokyo (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 14/484,743

(22) Filed: Sep. 12, 2014

(65) Prior Publication Data
US 2015/0077475 A1 Mar. 19, 2015

(30) Foreign Application Priority Data

Sep. 13, 2013 (JP) .................................. 2013-190114
Dec. 24, 2013 (JP) .................................. 2013-265120

(51) Int. Cl.
| | |
|---|---|
| *H01L 41/047* | (2006.01) |
| *H01L 41/09* | (2006.01) |
| *B41J 2/045* | (2006.01) |
| *B41J 2/14* | (2006.01) |
| *H01L 41/08* | (2006.01) |
| *H01L 41/25* | (2013.01) |
| *H01L 41/29* | (2013.01) |

(52) U.S. Cl.
CPC ........... *B41J 2/14233* (2013.01); *H01L 41/047* (2013.01); *H01L 41/0825* (2013.01); *H01L 41/25* (2013.01); *H01L 41/29* (2013.01); *B41J 2002/14266* (2013.01); *B41J 2002/14491* (2013.01)

(58) Field of Classification Search
USPC ............ 310/328, 366; 347/20, 44, 48, 50, 58, 347/68, 70
See application file for complete search history.

(56) References Cited

U.S. PATENT DOCUMENTS

| | | | |
|---|---|---|---|
| 6,109,738 A | 8/2000 | Miyata et al. | |
| 6,180,018 B1 * | 1/2001 | Miyagawa et al. | ............. 216/27 |

(Continued)

FOREIGN PATENT DOCUMENTS

| | | |
|---|---|---|
| JP | 3019845 | 3/2000 |
| JP | 3365485 | 1/2003 |

(Continued)

*Primary Examiner* — Thomas Dougherty
(74) *Attorney, Agent, or Firm* — Oblon, McClelland, Maier & Neustadt, L.L.P.

(57) ABSTRACT

An electromechanical transducer element includes a substrate; a first electrode formed on the substrate as a common electrode; an electromechanical transducer membrane formed on the first electrode; a second electrode formed on the electromechanical transducer membrane as an individual electrode; a first insulation protection membrane formed on the first and the second electrode; a third electrode electrically connected to the first electrode; a fourth electrode electrically connected to the second electrode; a second insulation protection membrane including a common electrode pad formed on the third electrode and plural individual electrode pads formed on the fourth electrode; and a fifth electrode formed so as to surround a vicinity of at least one of the individual electrode pads disposed at end parts.

Further, the fifth electrode is formed on the first insulation protection membrane and is electrically connected to the first electrode.

20 Claims, 19 Drawing Sheets

(56) References Cited

U.S. PATENT DOCUMENTS

| | | | |
|---|---|---|---|
| 6,739,703 B2 | 5/2004 | Higuchi et al. | |
| 6,974,985 B2 | 12/2005 | Kurasawa et al. | |
| 7,049,650 B1 | 5/2006 | Itokawa et al. | |
| 7,101,026 B2 | 9/2006 | Shimada et al. | |
| 7,122,851 B2 | 10/2006 | Itokawa et al. | |
| 7,183,601 B2 | 2/2007 | Nakazawa | |
| 7,622,852 B2 | 11/2009 | Ifuku et al. | |
| 7,651,199 B2 | 1/2010 | Takabe et al. | |
| 7,804,231 B2 | 9/2010 | Ifuku et al. | |
| 7,948,154 B2 | 5/2011 | Ifuku et al. | |
| 8,733,906 B2 | 5/2014 | Mizukami et al. | |
| 2006/0284940 A1* | 12/2006 | Katayama | 347/72 |
| 2009/0096844 A1* | 4/2009 | Kojima et al. | 347/72 |
| 2013/0162726 A1 | 6/2013 | Mizukami et al. | |

FOREIGN PATENT DOCUMENTS

| | | |
|---|---|---|
| JP | 2003-282987 | 10/2003 |
| JP | 2004-202849 | 7/2004 |
| JP | 3625417 | 3/2005 |
| JP | 3782401 | 6/2006 |
| JP | 2006-203190 | 8/2006 |
| JP | 3806127 | 8/2006 |
| JP | 3817729 | 9/2006 |
| JP | 2006-278562 | 10/2006 |
| JP | 4006562 | 11/2007 |
| JP | 2008-024532 | 2/2008 |
| JP | 4099818 | 6/2008 |
| JP | 4218309 | 2/2009 |
| JP | 4220459 | 2/2009 |
| JP | 4282245 | 6/2009 |
| JP | 2010-034154 | 2/2010 |
| JP | 5041765 | 10/2012 |
| JP | 5127268 | 1/2013 |
| JP | 5233398 | 7/2013 |

* cited by examiner

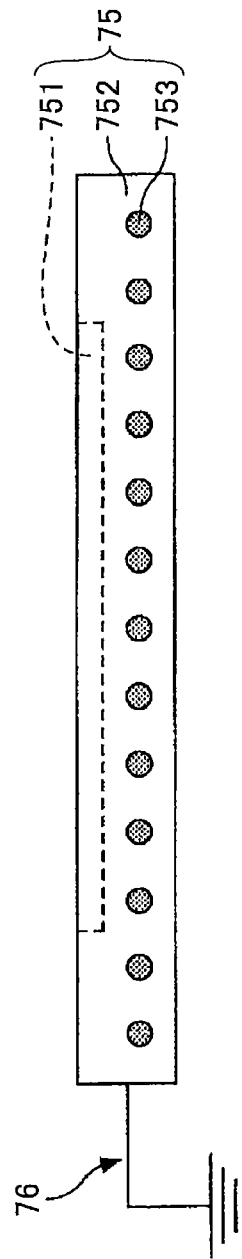
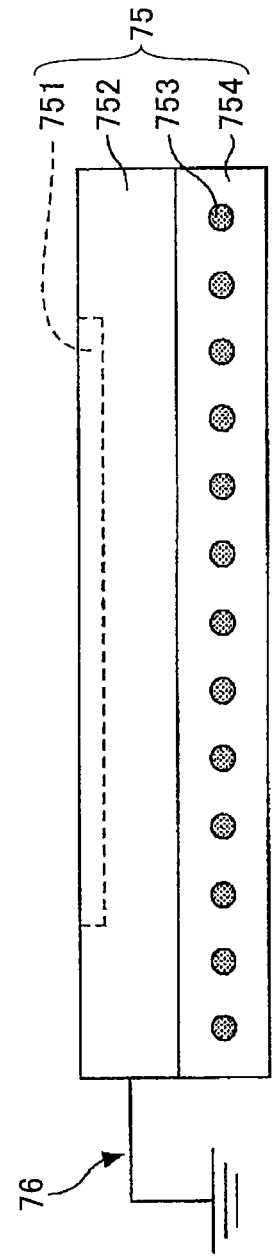
FIG.14A
FIG.14B

ELECTROMECHANICAL TRANSDUCER ELEMENT, METHOD OF MANUFACTURING THE SAME, LIQUID DROPLET DISCHARGE HEAD, AND LIQUID DROPLET DISCHARGE DEVICE

CROSS-REFERENCE TO RELATED APPLICATIONS

The present application is based on and claims the benefit of priority under 35 U.S.C §119 of Japanese Patent Application Nos. 2013-190114 filed Sep. 13, 2013 and 2013-265120 filed Dec. 24, 2013, the entire contents of which are hereby incorporated herein by reference.

BACKGROUND OF THE INVENTION

1. Field of the Invention

The present invention generally relates to an electromechanical transducer element, a method of manufacturing the electromechanical transducer element, a liquid droplet discharge head having the electromechanical transducer element, and a liquid droplet discharge device having the liquid droplet discharge head.

2. Description of the Related Art

As a configuration of an inkjet recording device and a liquid droplet discharge head used in an image recording apparatus or an image forming apparatus such as a printer, a facsimile machine, a copier, etc., there is a known configuration as illustrated in FIG. 1. FIG. 1 schematically illustrates an example configuration of a liquid droplet discharge head.

As illustrated in FIG. 1, the liquid droplet discharge head includes a nozzle plate 103 having a nozzle 102 formed (fabricated) therein, so that ink droplets are discharged through the nozzle 102, a compression chamber substrate 104 (Si substrate), and a base 105, so that a compression chamber 101 is defined by the nozzle plate 103 (as the lower surface), the compression chamber substrate 104 (as the side surfaces), and the base 105 (as the upper surface). Further, as a known discharge drive means to drive the discharge of ink droplets, there are, for example, an electromechanical transducer element 106 such as a piezoelectric element, an electro-thermal transducer such as a heater, and a means including a vibration plate forming a wall surface of an ink flow path and an electrode facing the vibration plate. Ink droplets can be discharged from the nozzle 102 by applying pressure to ink in the compression chamber 101 using energy that is generated by such an energy generation means described above. As such an energy generation means in an inkjet recording head, there are two types of practical means. One means is to use a piezoelectric actuator having a longitudinal (axial) vibration mode so as to extend (elongate) and contract (shrink) in the axis direction of the piezoelectric element. The other means is to use a piezoelectric actuator having a flexural oscillation mode.

Various types of inkjet recording heads using such an actuator having the flexural oscillation mode are known. For example, an electromechanical transducer element is formed as if it is independently formed for each of the pressure generation chambers by forming a uniform piezoelectric material layer across the entire surface of the vibration plate using a coating technique and cutting the piezoelectric material in the shapes corresponding to the pressure generation chambers using a lithography technique.

Further, as an example of an electromechanical transducer element used for the actuator having the flexural oscillation mode, there is an electromechanical transducer element formed of a lower electrode 106, which is a common electrode, a PZT film (piezoelectric body layer; electromechanical transducer film 107) formed on the lower electrode 106, and an upper electrode 108 which is an individual electrode formed on the PZT film. Further, an interlayer insulation film is formed on the upper electrode 108 to provide insulation between the lower electrode 106 and the upper electrode 108. Further, a contact hole is formed through the interlayer insulation film as an opening so that a wiring is electrically connected to the upper electrode 108 through the contact hole (see, for example, Japanese Patent Nos. 3365485 and 4218309).

However, as the lower electrode 106, a metal electrode in which Pt is mainly used as the base thereof is widely used. Therefore, there is a concern that it is difficult to provide assurance against the fatigue characteristics of PZT. This is because it is generally thought that the characteristics of PZT are degraded due to diffusion of Pb included in PZT. It is also known that the fatigue characteristics of PZT can be improved when an oxide electrode is used (see, for example, Japanese Patent No. 3019845).

FIGS. 2A and 2B illustrate polarization states of the PZT membrane before and after the polarization process is performed, respectively. As illustrated in FIGS. 2A and 2B, the polarization directions 21 in the piezoelectric body crystal just before voltage application are random (see FIG. 2A before the polarization process is performed). However, when a voltage is repeatedly applied to the piezoelectric body crystal, the polarization directions in most domains 20 are directed in the same direction, so that a set of domains 20 having the same polarization direction can be formed (see FIG. 2B after the polarization process is performed). In this regard, various trials have been conducted to align the directions of the polarizations before the voltage is applied thereto to stabilize a displacement relative to a predetermined drive voltage (see, for example, Japanese Laid-open Patent Publication Nos. 2004-202849 and 2010-34154). This process may be called as an aging process or a poling process (polarization process). Specifically, a method has been conducted of applying a high voltage exceeding a drive pulse voltage to the piezoelectric element.

SUMMARY OF THE INVENTION

According to an aspect of the present invention, an electromechanical transducer element includes:

a substrate;

a first electrode formed on the substrate and serving as a common electrode;

an electromechanical transducer membrane formed on the first electrode;

a second electrode formed on the electromechanical transducer membrane and serving as an individual electrode;

a first insulation protection membrane formed on the first electrode and the second electrode and having plural contact holes;

a third electrode formed so as to be electrically connected to the first electrode through one of the contact holes;

a fourth electrode formed so as to be electrically connected to the second electrode through one of the contact holes;

a second insulation protection membrane including a common electrode pad formed on the third electrode and plural individual electrode pads formed on the fourth electrode and in a predetermined line; and a fifth electrode formed so as to surround a vicinity of at least one of the individual electrode pads disposed at end parts in the predetermined line, wherein the fifth electrode is formed on the first insulation protection membrane and is electrically connected to the first electrode through one of the contact holes.

BRIEF DESCRIPTION OF THE DRAWINGS

Other objects, features, and advantages of the present invention will become more apparent from the following description when read in conjunction with the accompanying drawings, in which:

FIG. 14A is an example cross-sectional view when cut along the line A-A' of FIG. 12;

FIG. 14B is another example cross-sectional view when cut along the line A-A' of FIG. 12;

DETAILED DESCRIPTION OF THE PREFERRED EMBODIMENTS

In related art technologies, more specifically in a process where a drive pulse voltage is applied as described in Japanese Laid-open Patent Publication Nos. 2004-202849 and 2010-34154, the specific voltage application method is not sufficiently disclosed. In this regard, if it is assumed that, for example, a probe card is used to process in a wafer level, the cost of manufacturing such a probe card is increased depending on the number of the arranged terminal electrodes and the arrangement thereof. Further, if the number of terminal electrodes to be processed by a single probe card is small, it may take much time to process in the wafer level.

Further, according to the method described in, for example, Japanese Laid-open Patent Publication No. 2006-203190, by generating corona discharge by applying a voltage between the electrode and the charge supply means, charges are supplied to generate an electric field in the piezoelectric body.

Figure 3:
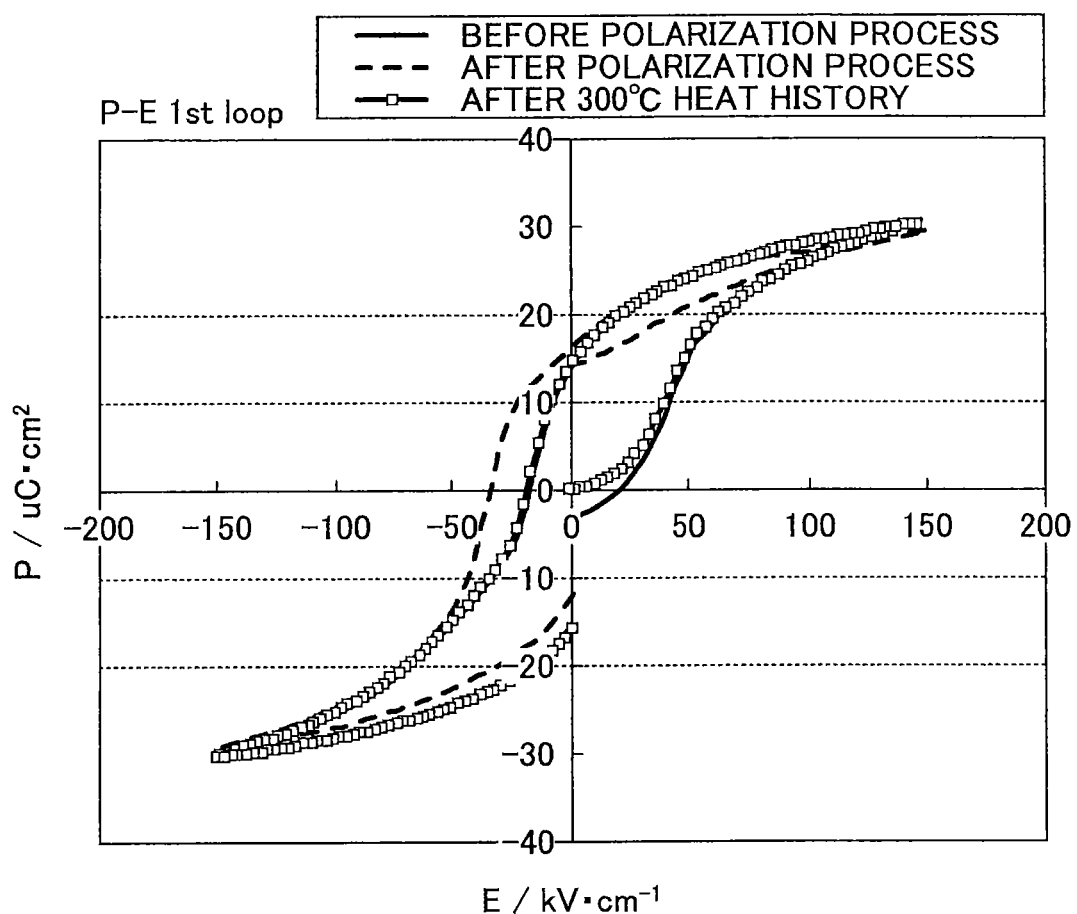
FIG. 3 is a graph of P-E hysteresis loops before and after the polarization process is performed.

However, in the process using the corona wire described in Japanese Laid-open Patent Publication No. 2006-203190, the process is performed after the piezoelectric membrane is formed. Therefore, it is a concern that depolarization occurs due to an effect of heat history in the subsequent processes (i.e., in forming an interlayer membrane and a lead wiring). Specifically, FIG. 3 is a graph of the P-E hysteresis loops before and after the polarization process is performed. When the heat (heat history) at the temperature of 300° C. or more is applied after the process, the state goes back to the state before the process.

The present invention is made in light of the above problems, and may provide an electromechanical transducer element having a desired polarization state and excellent electronic characteristics and durability.

According to an embodiment, an electromechanical transducer element includes a substrate;

a first electrode formed on the substrate and serving as a common electrode;

an electromechanical transducer membrane formed on the first electrode;

a second electrode formed on the electromechanical transducer membrane and serving as an individual electrode;

a first insulation protection membrane formed on the first electrode and the second electrode and having plural contact holes;

a third electrode formed so as to be electrically connected to the first electrode through one of the contact holes;

a fourth electrode formed so as to be electrically connected to the second electrode through one of the contact holes;

a second insulation protection membrane including a common electrode pad formed on the third electrode and plural individual electrode pads formed on the fourth electrode and in a predetermined line; and a fifth electrode formed so as to surround a vicinity of at least one of the individual electrode pads disposed at end parts in the predetermined line.

Further, the fifth electrode is formed on the first insulation protection membrane and is electrically connected to the first electrode through one of the contact holes.

According to another embodiment, an electromechanical transducer element includes:

a substrate;

a first electrode formed on the substrate and serving as a common electrode;

an electromechanical transducer membrane formed on the first electrode;

a second electrode formed on the electromechanical transducer membrane and serving as an individual electrode;

a first insulation protection membrane formed on the first electrode and the second electrode and having plural contact holes;

a third electrode formed so as to be electrically connected to the first electrode through one of the contact holes;

a fourth electrode formed so as to be electrically connected to the second electrode through one of the contact holes;

a second insulation protection membrane including a common electrode pad formed on the third electrode and plural individual electrode pads formed on the fourth electrode and in a predetermined line; and a fifth electrode formed so as to surround a vicinity of one of separated individual electrode pads which are separated from each other by a distance greater than a distance between adjacent individual electrode pads except for the separated individual electrode pads in the predetermined line.

Further, the fifth electrode is formed on the first insulation protection membrane and is electrically connected to the first electrode through one of the contact holes.

Further, as described above, the depolarization may occur due to an effect of the heat history. Therefore, it is preferable that the process using the corona wire be performed after the process where the heat (heat history) is applied. In this regard, in an embodiment, the process using the corona wire is performed after the heat (heat history) process at the temperature of 300° C. or more.

Further, in an embodiment, the polarization process is performed by injecting charges generated by corona discharge or glow discharge via an electrode pad section so that the polarization process can be collectively performed in the wafer level. By doing this, it becomes possible to provide an electromechanical transducer element in which the displacement change by repeating the voltage application can be reduced. This is preferable because it becomes possible to keep the ink discharge characteristics in a good condition and acquire stable ink discharge characteristics and it also becomes possible to arrange the electromechanical transducer elements in high density.

Here, the inventors of the present invention have newly found that, in the polarization process by injecting charges by corona discharge or the like, charges are concentrated in a drive channel individual electrode section at the end part in the same row (line) (i.e., "end section individual electrode pad"). Due to this, a failure occurs such as characteristic variation even in the same row due to excessive progression of the polarization process and insulation breakdown between upper and lower electrodes due to excessive charge injection.

Figure 20:
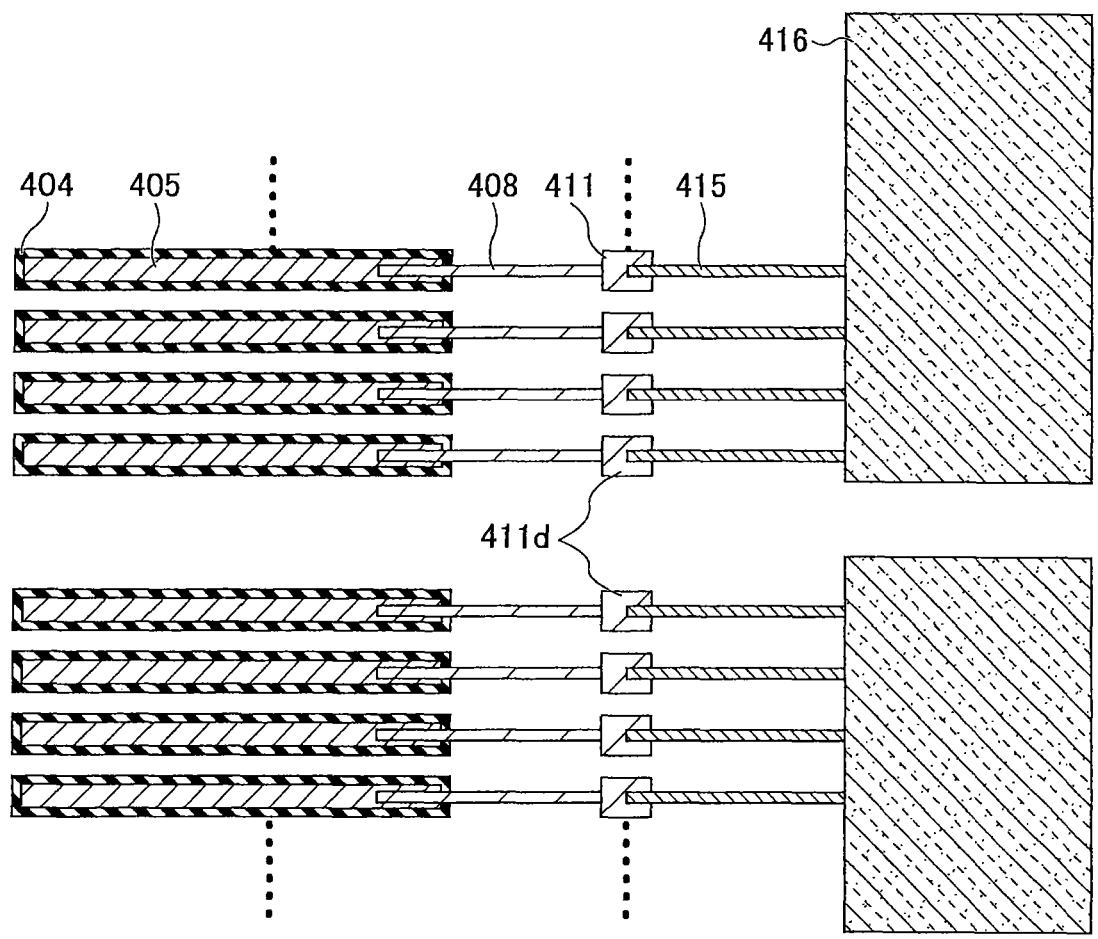
FIG. 20 illustrates a layout relationship between ICs in an electromechanical transducer element in related art.

Further, as described in Japanese Patent No. 5233398, when two ICs 416 and a drive voltage wire line 415 for IC connection are arranged near the PAD for individual electrode, the distance between lead wirings is elongated, and two separated individual electrode pads 411d among the individual electrode pads arranged in the line may be separated and arranged. The inventors of the present invention have newly found that, similar to the case of the end section individual electrode pad described above, in this case as well, charges are concentrated in those separated individual electrode pads 411d, so that a failure occurs such as characteristic variation even in the same row due to excessive progression of the polarization process and insulation breakdown between upper and lower electrodes due to excessive charge injection (see FIG. 20).

To overcome the problem(s), the inventors of the present invention have completed the present invention by developing a head configuration where it becomes possible to inject a uniform charge amount into the drive channel individual electrode pad section.

Next, details of the electromechanical transducer element according to embodiments are described. In the following embodiments, only preferred embodiments are described. Therefore, various preferable technical limitations are added. However, it should be noted that the present invention is not limited to those embodiment unless otherwise limitation on the present invention is specifically described in the description. Electromechanical transducer element in first embodiment An example configuration of an electromechanical transducer element (hereinafter may be simplified as a "piezoelectric element") is illustrated in FIG. 4.

Figure 4:
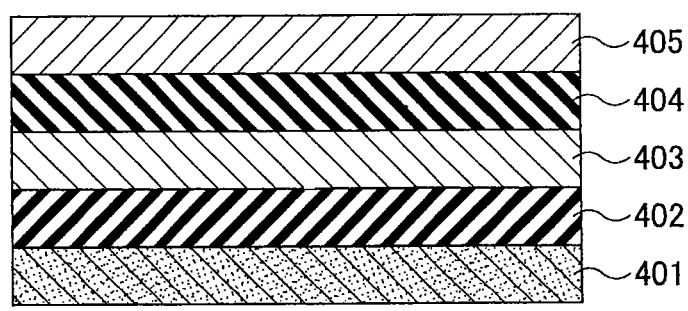
FIG. 4 schematically illustrates an example configuration of a part of an electromechanical transducer element according to an embodiment.

FIG. 4 schematically illustrates a part of a configuration of an electromechanical transducer element according to an embodiment.

As illustrated in FIG. 4, the electromechanical transducer element according to the embodiment includes a substrate 401, a membrane vibration plate 402 as a base membrane, a first electrode 403, an electromechanical transducer membrane 404, and a second electrode 405 which are disposed (laminated) in this order. More details of the element configuration, including an interlayer film and a lead wiring, are described below.

Here, before a configuration of the electromechanical transducer element according to an embodiment is described, a configuration of an electromechanical transducer element in related art is described for understanding the present invention. Here, the laminated configuration described with reference to FIG. 4 is applied to not only the electromechanical transducer element according to an embodiment but also an electromechanical transducer element in related art.

Figure 5A:
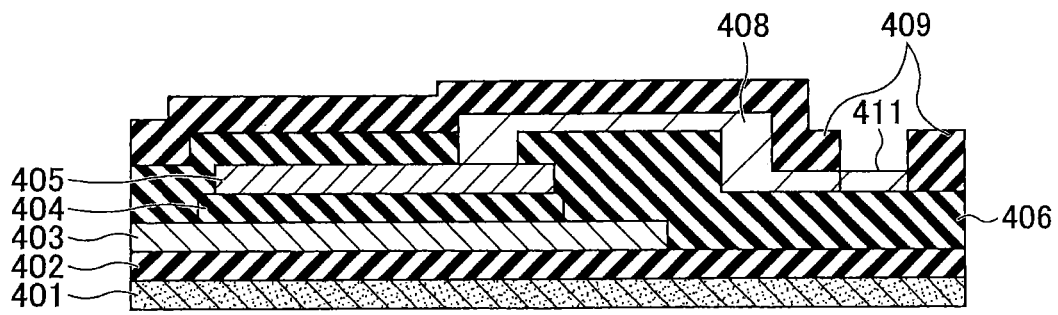
FIG. 5A is a cross-sectional view 1 of an electromechanical transducer element in related art.
Figure 5B:
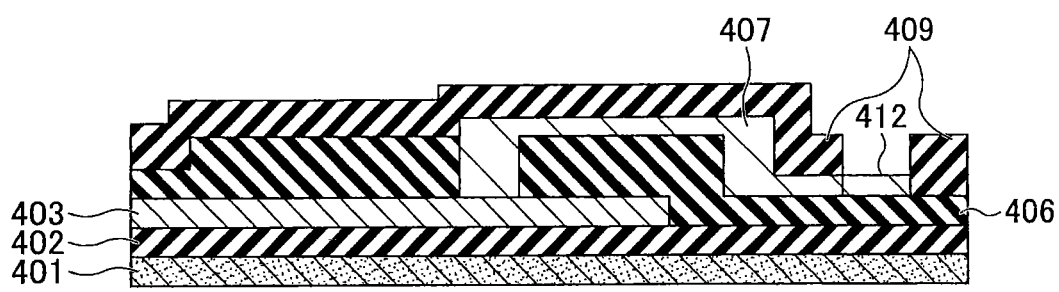
FIG. 5B is a cross-sectional view 2 of an electromechanical transducer element in related art.
Figure 5C:
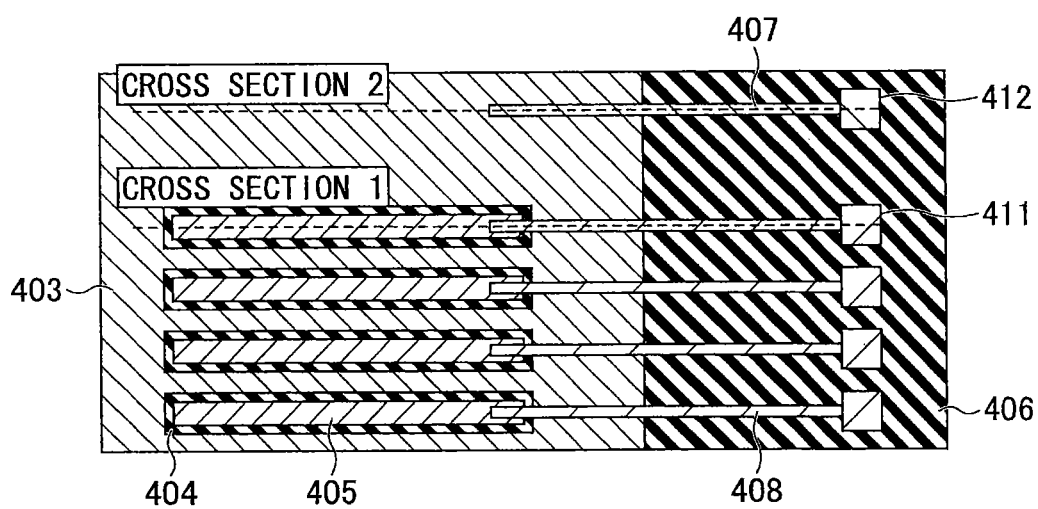
FIG. 5C is a top view of an electromechanical transducer element in related art.

FIG. 5A is a cross-sectional view 1 of an electromechanical transducer element in related art. FIG. 5B is a cross-sectional view 2 of an electromechanical transducer element in related art. FIG. 5C is a top view of an electromechanical transducer element in related art. In FIG. 5C, for explanatory purposes, descriptions of a second insulation protection membrane 409 and a first insulation protection membrane 406 formed on the first electrode 403 are omitted.

The first insulation protection membrane 406 includes plural contact holes, so that the first electrode 403 is in contact with a third electrode 407 and the second electrode 405 is in contact with a fourth electrode 408. In this case, it is assumed that the first and the third electrodes are common electrodes and the second and the fourth electrodes are individual electrodes, and the second insulation protection membrane 409 protecting the common electrodes and the individual electrodes is formed. Further, openings are formed in parts of the second insulation protection membrane 409, so that a part of the individual electrode serves as an individual electrode pad 411, and a part of the common electrode serves as a common electrode pad 412. Namely, the pad formed for the common electrode is the common electrode pad 412, and the pad formed for the individual electrode is the individual electrode pad 411.

Next, corona discharge or glow discharge is performed on the piezoelectric element formed so far, so that the generated charges are injected through the pad sections to perform the polarization process.

Figure 6:
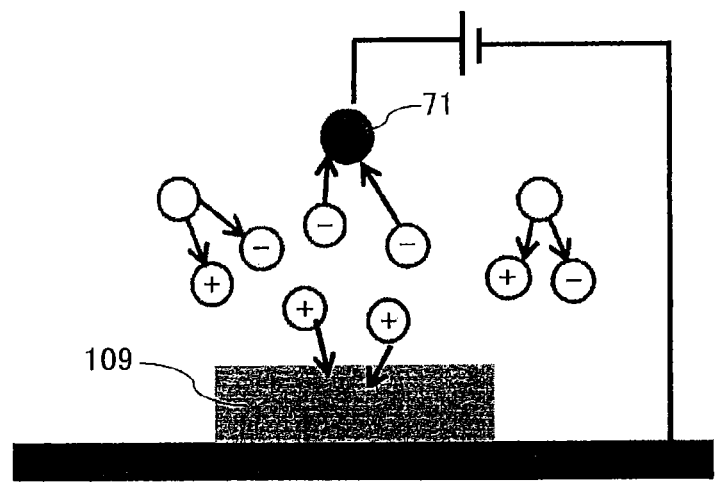
FIG. 6 illustrates discharge from a corona wire.

FIG. 6 illustrates the discharge using the corona wire. As illustrated in FIG. 6, when corona discharge is conducted using a corona electrode 71 (corona wire), cations are generated by ionizing molecules of the air and flows through the pad sections of the piezoelectric element so that charges are accumulated in the piezoelectric element.

Figure 7:
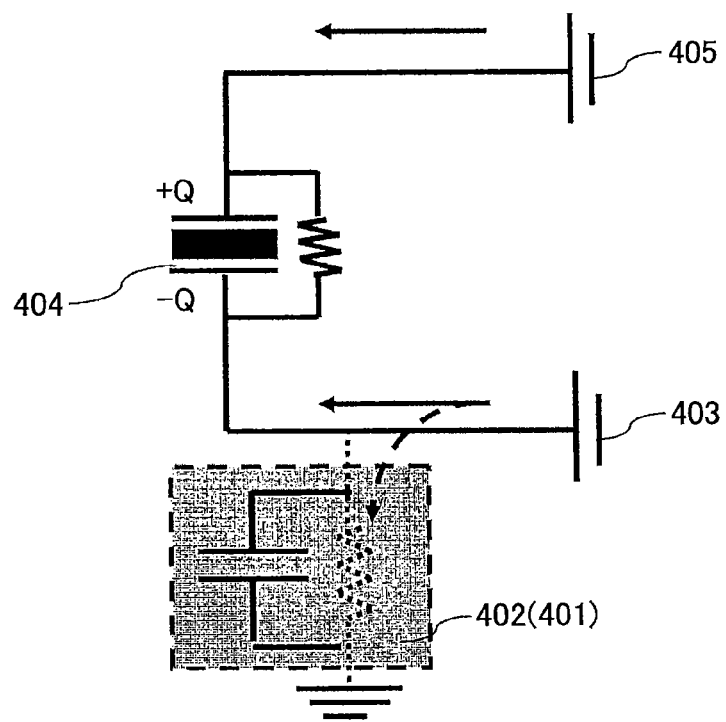
FIG. 7 illustrates charge movement from an individual electrode and a common electrode.

Further, FIG. 7 illustrates charge movement from the individual electrode and the common electrode. As illustrated in FIG. 7, it is thought that the generated cations flows into both the individual electrode pad 411 and the common electrode pad 412. Here, it is also thought that the cations flowing into the common electrode pad 412 flow to ground (GND) via the membrane vibration plate 402 and the substrate 401 under the first electrode 403, so that the voltage difference is generated by the charges charged in the individual electrodes to conduct the polarization process.

Here, in a case where plural piezoelectric elements are arranged in a predetermined row (line) as illustrated in FIGS. 5A through 5C, when the polarization process is conducted by injecting charges by corona discharge or the like, charges are concentrated in a drive channel individual electrode sections at the end part in the same row (which is also called the "end part individual electrode pads", hereinafter may be referred to as "individual electrode pads at end parts"). The inventors of the present invention have found that due to this charge concentration, a failure occurs such as characteristic variation in the same row due to excessive progression of the polarization process and insulation breakdown between upper and lower electrodes due to excessive charge injection. Further, similar to the case of the above end part individual electrode pads, charges are concentrated in the separated individual electrode pads 411d (hereinafter may be referred to as "center individual electrode pads"). The inventors of the present invention have also found that due to this charge concentration, a failure occurs such as characteristic variation in the same row due to excessive progression of the polarization process and insulation breakdown between upper and lower electrodes due to excessive charge injection.

To resolve the problems, in the following, an embodiment where the charge concentration in the end part individual electrode pads is prevented (the first embodiment, i.e., this embodiment) is first described. Then, another embodiment where the charge concentration in the separated individual electrode pads 411d is prevented (the second embodiment) is described.

To prevent the charge concentration in the individual electrode pads 411c at end parts, an L-shaped electrode (fifth electrode 410) is formed so as to surround the vicinity of the individual electrode pads 411c at at least one end part as illustrated in FIG. 8, so that excessive charges flow into the electrode surrounding the vicinity of the individual electrode pads 411c. More details of the shape of the fifth electrode 410 are described. The shape of the fifth electrode 410 is formed so that one side of the L-shaped fifth electrode 410 is disposed on one side of the individual electrode pad 411c at one end part thereof (which is on the side where there no adjacent individual electrode pad 411c exists) (however, excluding one side of the fourth electrode 408) and the L-shaped fifth electrode 410 surrounds the vicinity of the end part of the individual electrode pads 411c. However, it should be noted that the shape of the fifth electrode 410 is not limited to the L shape.

Figure 8A:
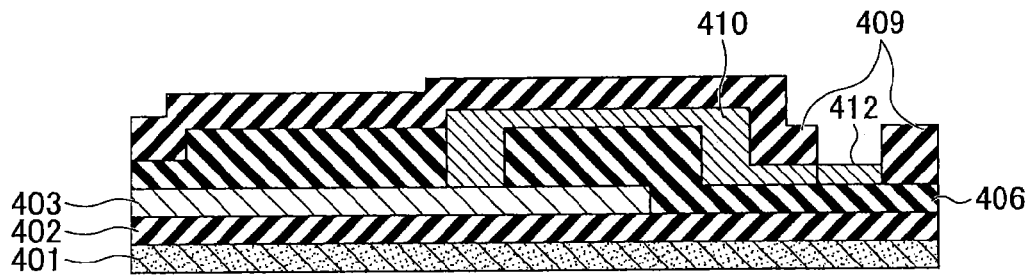
FIG. 8A is a cross-sectional view of an electromechanical transducer element according to a first embodiment.
Figure 8B:
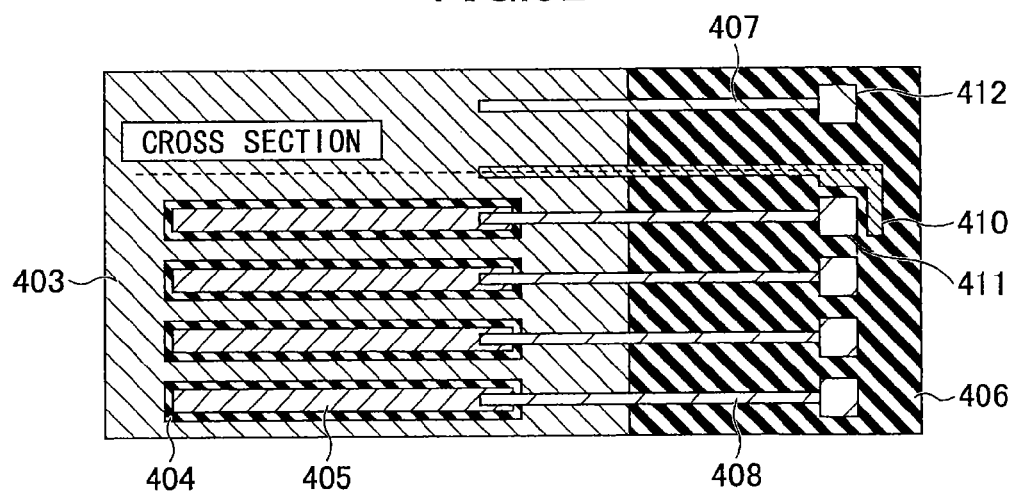
FIG. 8B is a top view of the electromechanical transducer element according to the first embodiment.

FIG. 8A is a cross-sectional view of an electromechanical transducer element according to a first embodiment. FIG. 8B is a top view of the electromechanical transducer element according to the first embodiment. In FIG. 8B, for explanatory purposes, descriptions of the second insulation protection membrane 409 and the first insulation protection membrane 406 formed on the first electrode 403 are omitted.

Figure 9:
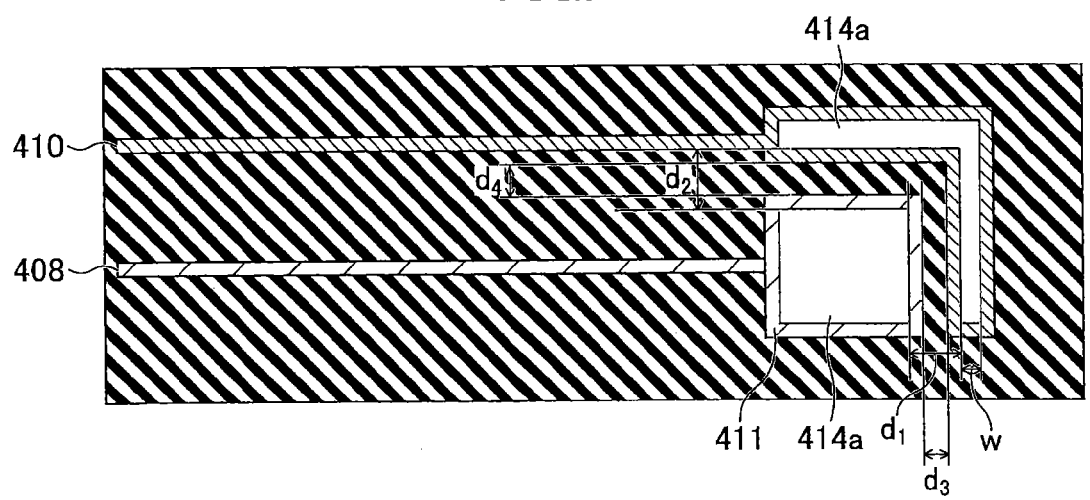
FIG. 9 illustrates a layout relationship between openings of a second insulation protection membrane according to the first embodiment.

The fifth electrode 410 is formed on the first insulation protection membrane 406 and is electrically connected to the first electrode 403 through the contact hole. Although, the second insulation protection membrane 409 is formed on the first electrode 403, as illustrated in FIGS. 8A and 9, the second insulation protection membrane 409 has an L-shaped opening formed so as to surround the vicinity of the individual electrode pads 411c. Here, FIG. 9 illustrates a layout relationship between openings of the second insulation protection membrane 409.

It is preferable that the width of the fifth electrode 410 is greater than or equal to 20 µm and less than or equal to 100 µm. Further, as illustrated in FIG. 9, the layout relationship between an opening part 414a and an opening part 414b becomes important. Here, the opening part 414a is an opening region of the second insulation protection membrane 409 formed on the fifth electrode 410, and the opening part 414b is an opening region formed on the individual electrode pads 411c disposed on the end part. Here, the distances "$d_1$" and "$d_2$" are defined as the distances between the opening part 414a, which is the opening region of the second insulation protection membrane 409 formed on the fifth electrode 410, and the opening part 414b, which is the opening region formed on the individual electrode pads 411c disposed on the end part, as illustrated in FIG. 9. In this case, it is preferable that the distances "$d_1$" and "$d_2$" (FIG. 9) are greater than or equal to 5 µm and less than or equal to 50 µm. More preferably, the distances "$d_1$" and "$d_2$" are greater than or equal to 6 µm and less than or equal to 20 µm. Namely, if the distances "$d_1$" and "$d_2$" are less than the range, charges are concentrated in (the vicinity of) the fifth electrode 410, so that charges are unlikely to be accumulated in (the vicinity of) the individual electrode pad 411c in the edge part. As a result, it becomes difficult to achieve (promote) the polarization. On the other hand, if the distances "$d_1$" and "$d_2$" are greater than the range, most charges are accumulated in (the vicinity of) the individual electrode pad 411c in the edge part, so that it becomes difficult for the fifth electrode 410 to sufficiently accumulate excessive charges.

Further, as illustrated in FIG. 9, the opening width "w" of the opening part 414a (white part) which is the opening region of the second insulation protection membrane 409 formed on the fifth electrode 410 becomes important. It is preferable that the opening width "w" (FIG. 9) is greater than or equal to 10 μm. More preferably, the opening width "w" is greater than or equal to 20 μm. If the opening width "w" is less than the value, most charges are concentrated in the individual electrode pad 411c in the edge part, so that it becomes difficult for the fifth electrode 410 to sufficiently accumulate excessive charges. Also, the opening width "w" is less than or equal to 80 μm.

Further, the distances "$d_3$" and "$d_4$" are defined as the distances between the electrode part, which is formed so as to surround the vicinity of the individual electrode pad 411c in the edge part (L-shaped part in FIG. 9), and individual electrode pads 411c disposed on the end part as illustrated in FIG. 9. In this case, it is preferable that the distances "$d_3$" and "$d_4$" are greater than or equal to 3 μm and less than or equal to 50 μm. Namely, if the distances "$d_3$" and "$d_4$" are less than the range, charges are concentrated in the fifth electrode 410, so that charges are unlikely to be accumulated in the individual electrode pad 411c in the edge part. As a result, it becomes difficult to achieve (promote) the polarization. On the other hand, if the distances "$d_3$" and "$d_4$" are greater than the range, most charges are accumulated in the individual electrode pad 411c in the edge part, so that it becomes difficult for the fifth electrode 410 to sufficiently accumulate excessive charges.

Figure 10:
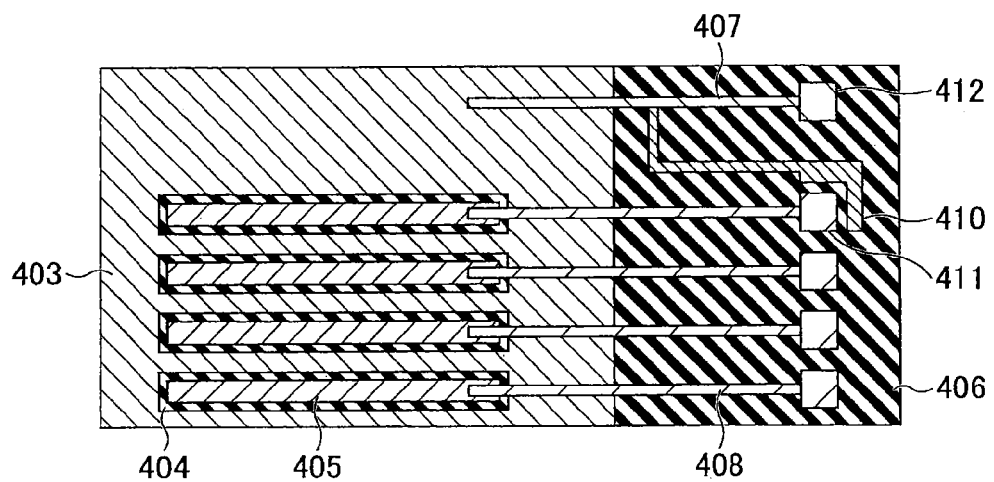
FIG. 10 is a top view of another example configuration of an electromechanical transducer element according to the first embodiment.

Modified Example 1 in the First Embodiment of the Electromechanical Transducer Element FIG. 10 is a top view of another example configuration of an electromechanical transducer element according to the first embodiment. In FIG. 10 as well, for explanatory purposes, descriptions of the second insulation protection membrane 409 and the first insulation protection membrane 406 formed on the first electrode 403 are omitted. Here, the fifth electrode 410 may have a pattern shape, as illustrated in FIG. 10, to be electrically connected to the third electrode 407.

Figure 11A:
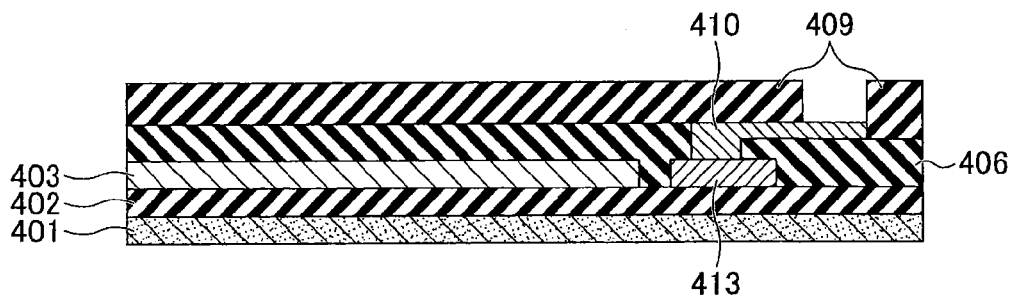
FIG. 11A is a cross-sectional view of still another example configuration of an electromechanical transducer element according to the first embodiment.
Figure 11B:
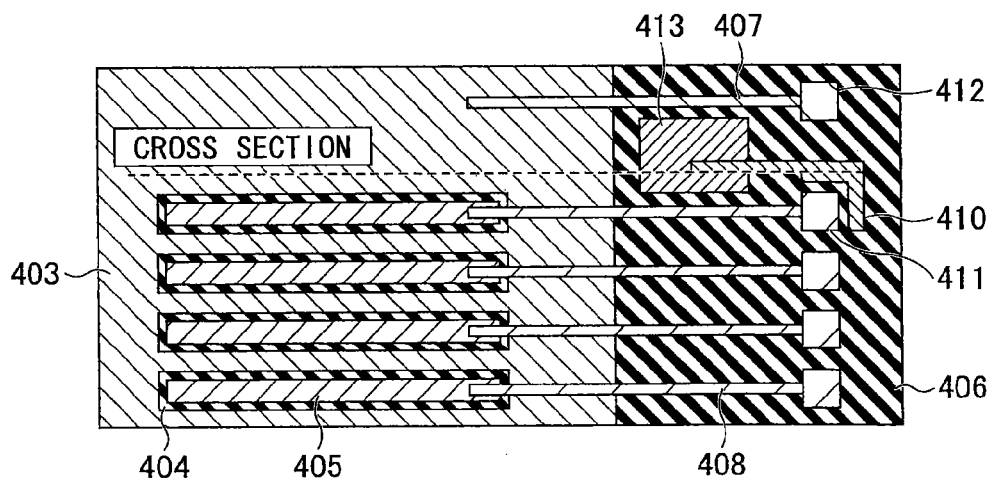
FIG. 11B is a top view of still another example configuration of the electromechanical transducer element according to the first embodiment.

Modified Example 2 in the First Embodiment of the Electromechanical Transducer Element Further, as illustrated in FIGS. 11A and 11B, the fifth electrode 410 may have a pattern shape to be electrically connected to a sixth electrode 413 through the contact hole, the sixth electrode 413 being independently formed on the substrate 401 or the base membrane from (besides) the first electrode 403.

Here, FIG. 11A is a cross-sectional view of another example configuration of an electromechanical transducer element according to the first embodiment. FIG. 11B is a cross-sectional view of still another example configuration of the electromechanical transducer element according to the first embodiment. In FIG. 11B, for explanatory purposes, descriptions of the second insulation protection membrane 409 and the first insulation protection membrane 406 formed on the first electrode 403 and the sixth electrode 413 are omitted. The inventors of the present invention have acknowledged that when extra charges by corona discharge flow to GND through the fifth electrode 410 and the membrane vibration plate 402 and the substrate 401 which are under the sixth electrode 413, the same effect as those in pattern shapes in FIGS. 8A through 10 can be obtained.

Figure 12:
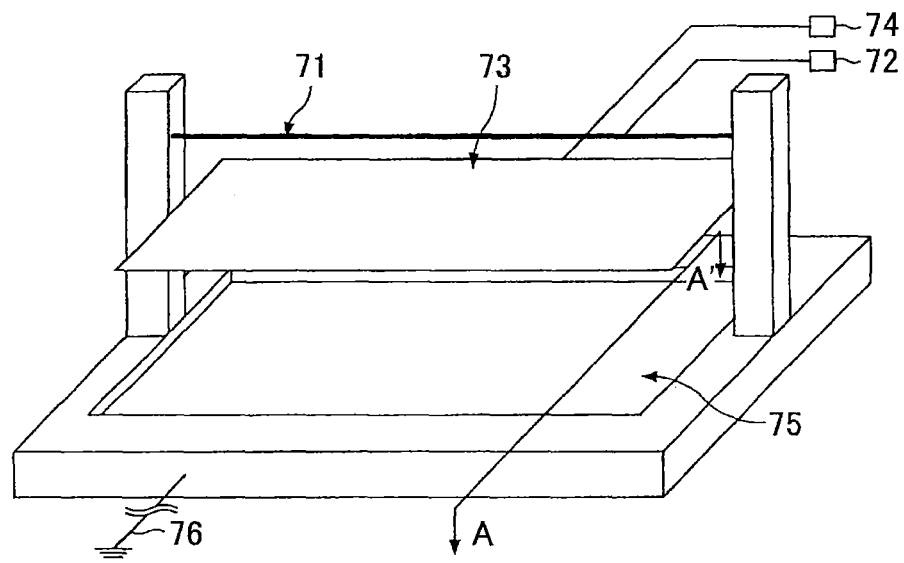
FIG. 12 schematically illustrates an example of a main part of a polarization processing device included in a part of a manufacturing apparatus to manufacture the electromechanical transducer element.
Figure 13:
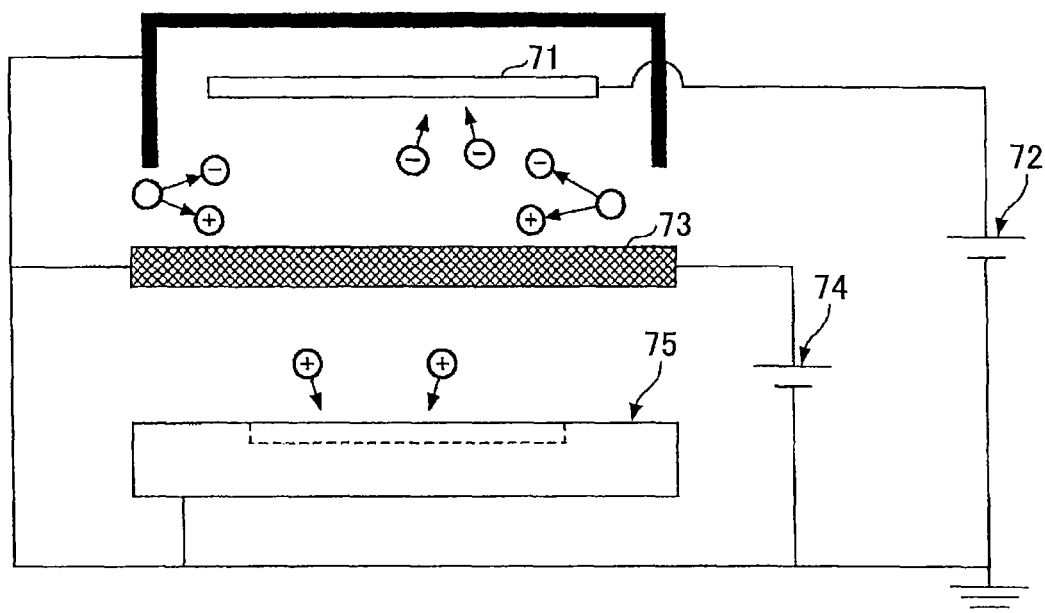
FIG. 13 schematically illustrates an example configuration of the polarization processing device included in the part of the manufacturing apparatus to manufacture the electromechanical transducer element.

Next, a process is performed on the piezoelectric elements manufactured as described above by using the polarization processing device as illustrated in FIGS. 12 through 14.

FIG. 12 schematically illustrates an example of a main part of a polarization processing device included in a part of a manufacturing apparatus to manufacture the electromechanical transducer element according to an embodiment. FIG. 13 schematically illustrates an example wirings of the polarization processing device included in the part of the manufacturing apparatus to manufacture the electromechanical transducer element according to an embodiment. FIG. 14A is an example cross-sectional view when cut along the line A-A' of FIG. 12. FIG. 14B is another example cross-sectional view when cut along the line A-A' of FIG. 12.

As illustrated in FIG. 12, the manufacturing apparatus to manufacture the electromechanical transducer element according to an embodiment includes a corona electrode 71 and a grid electrode 73. The corona electrode 71 and the grid electrode 73 are connected to a corona electrode power source 72 and a grid electrode power source 74, respectively. In this case, as illustrated in FIG. 13, the other terminal, which is not connected to the corona electrode power source 72 or the grid electrode power source 74, may be connected to, for example, the place of the sample stage 75 where a sample is placed. Otherwise, as described below, the terminal may be connected to a ground line 76 when the ground line 76 is connected to the sample stage 75.

The configuration of the corona electrode 71 is not limited to a specific configuration. For example, as schematically illustrated in FIG. 12, the corona electrode 71 may have a wiring shape and the wiring may be made of one of various electrically conductive materials.

The grid electrode 73 is disposed between the corona electrode 71 and the sample stage 75. The configuration of the grid electrode 73 is not limited to a specific configuration. However, for example, it is preferable that a meshing process be performed on the grid electrode 73 so that when a high voltage is applied to the corona electrode 71, ions and charges generated by corona discharge can effectively fall onto the sample stage 75.

Further, the sample stage 75 is equipped with a heat mechanism to heat the electromechanical transducer element placed on the sample stage 75. The method to be employed in the heat mechanism is not limited to a specific method. However, one of various heaters or a lamp may be used as a heating means. Further, the heat mechanism may be installed in the sample stage 75 or may be disposed out of the sample stage 75 to externally heat. However, it is preferable for the heat mechanism to be installed in the sample stage 75 to avoid interference with the electrodes, etc.

A case where the heat mechanism is installed in the sample stage 75 is described with reference to FIG. 14. Note that, as described above, the configuration of the heat mechanism is not limited to the configuration described below.

As illustrated in FIG. 14A, the sample stage 75 includes a sample support section 752. The sample support section 752 includes a groove 751, which is formed to fit the figure of a sample to support the sample, and a heat mechanism 753 made of a heating wire or the like. Further, as described below, the ground line 76 may be connected to the sample stage 75. It is preferable to have the configuration described above uniformly heat the sample. Especially, from a viewpoint of uniformly heating the sample, it is preferable that the sample support section 752 is made of a metal. It is more preferable that the sample support section 752 is made of, for example, stainless steel or INCONEL (registered trademark).

As another example configuration, as illustrated in FIG. 14B, the sample stage 75 may include the sample support section 752 and a heat mechanism support section 754. In this case, the groove 751 to support the sample may be formed in the sample support section 752. On the other hand, the heat mechanism 753 including a heating wire or the like may be formed in the heat mechanism support section 754. In this case, to enhance the heat conductivity, it is preferable that the sample support section 752 is made of a metal. It is more preferable that the sample support section 752 is made of, for example, stainless steel or INCONEL (registered trademark). Especially, from a viewpoint of uniformly heating the sample, it is more preferable that the sample support section 752 is made of INCONEL (registered trademark). In the configuration in FIG. 14B, the sample support section 752 and the heat mechanism support section 754 may be simply laminated on each other. Otherwise, for example, the ample support section 752 and the heat mechanism support section 754 may be adhered to each other with adhesive or may be fixed to each other with a fixing member.

In FIGS. 14A and 14B, a case is described where the groove 751 to support the sample is provided. However, the sample may be placed on any position on the sample support section 752 without providing (forming) the groove 751.

The maximum heat temperature of the heat mechanism 753 is not limited to a specific temperature. As described below, for example, the heat mechanism 753 may be heated at a predetermined temperature in accordance with a Curie temperature of the electromechanical transducer membrane of the electromechanical transducer element which is manufactured as described below. In this regard, it is preferable that maximum heat temperature of the heat mechanism 753 is 350° C. so as to correspond to various electromechanical transducer elements.

Further, in order to make it easier to flow a current through the sample placed on the sample stage 75, it is preferable that the sample stage on which the sample is placed is grounded. Namely, it is preferable that the sample stage 75 is connected to the ground line 76.

The voltage to be applied for the corona electrode 71 and the grid electrode 73 and the distances between the sample and the electrodes are not limited to the specific values. Namely, it is possible to determine (adjust) those values, so that the polarization process can be sufficiently performed and strength of corona discharge can be adjusted.

Further, necessary charge amount "Q" in the polarization process is not limited to a specific amount. However, it is preferable that positively-charged charges having a charge amount of $1.0\times10^{-8}$ C or more are accumulated in the electromechanical transducer element by corona discharge or glow discharge. More preferably, positively-charged charges having a charge amount of $4.0\times10^{-8}$ C or more are accumulated. By accumulating a charge amount in the range into the electromechanical transducer element, it becomes possible to perform the polarization process so as to reliably have a desired polarizability.

Figure 15A:
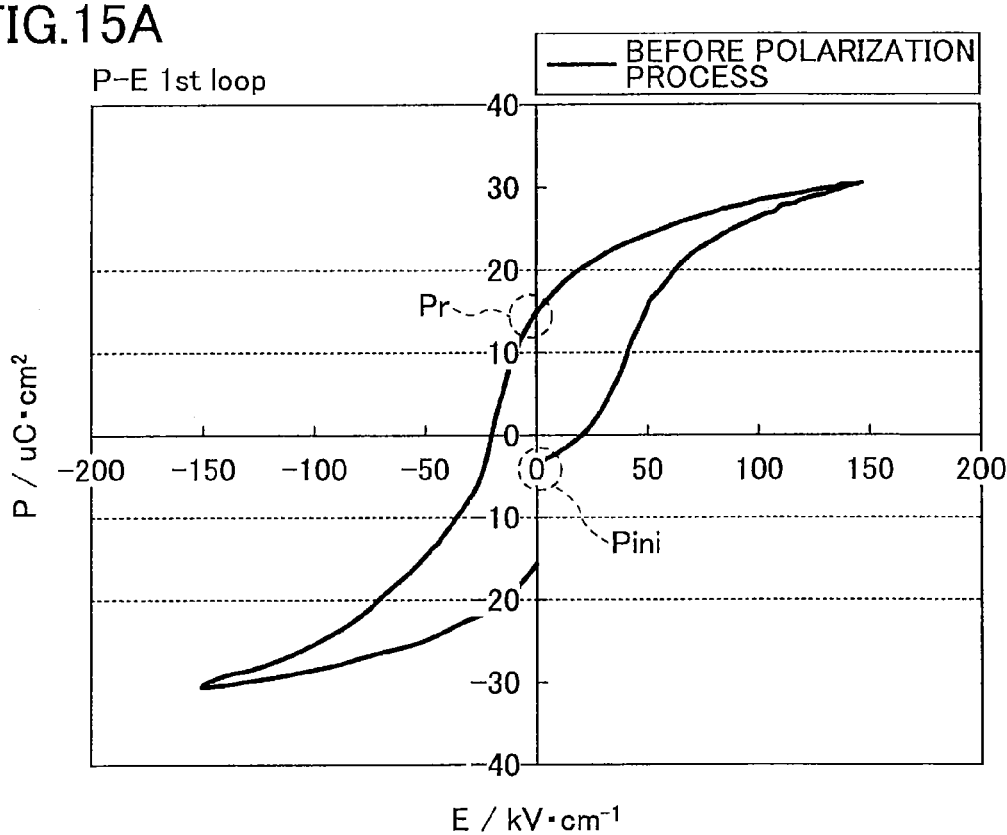
FIG. 15A is a graph of an example P-E hysteresis loop before the polarization process is performed.
Figure 15B:
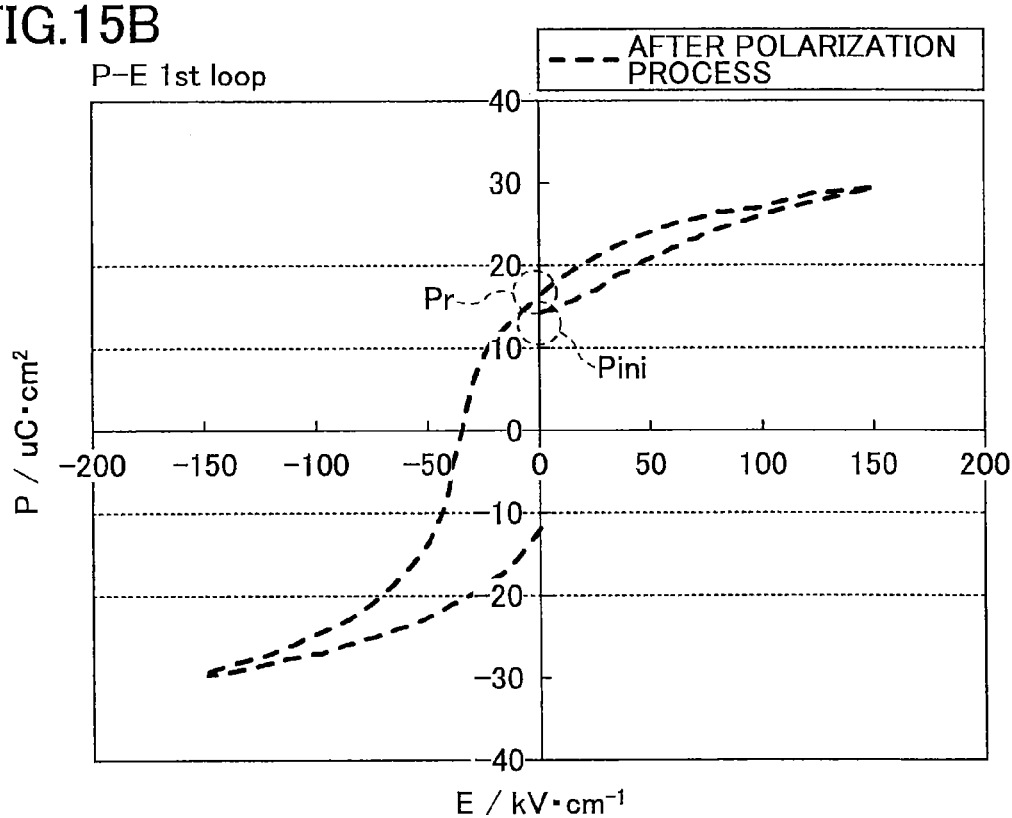
FIG. 15B is a graph of an example P-E hysteresis loop after the polarization process is performed.

Here, the state of the polarization process is determined based on the P-E hysteresis loop. FIG. 15A is a graph of an example P-E hysteresis loop before the polarization process is performed. FIG. 15B is a graph of an example P-E hysteresis loop after the polarization process is performed. As illustrated in FIGS. 15A and 15B, the hysteresis loop is measured by applying electric field intensity of ±150 kV/cm, a value of (Pr-Pini) is defined as the polarizability, where "Pr" denotes the polarization upon the initial voltage of 0 kV/cm, and "Pini" denotes the polarization when the voltage is 0 kV/cm after the voltage from +150 kV/cm is applied and the voltage is returned to 0 kV/cm. Based on the polarizability (i.e., the value of (Pr-Pini)), it is determined whether the polarization (state) is good. Here, it is preferable that the polarizability (Pr-Pini) is less than or equal to 10 μC/cm². It is more preferable that the polarizability (Pr-Pini) is less than or equal to 5 μC/cm². When the polarizability does not satisfy the value, it becomes difficult to obtain sufficient characteristics in displacement degradation after consecutive driving as the PZT piezoelectric actuator.

A desired polarizability (Pr-Pini) can be acquired by adjusting, for example, the voltage values of the corona electrode 71 and the grid electrode 73, the distance between the sample stage 75 and the corona electrode 71, and the distance between the sample stage 75 and the grid electrode 73. However, in order to obtain the desired polarizability (Pr-Pini), it is necessary to apply high electric field to the electromechanical transducer membrane.

In this regard, however, the inventors of the present invention have found that in a case where, as illustrated in FIGS. 5A through 5C, a current between the individual electrodes and a current between the common electrode and the individual electrode are measured, and if the leak current amount is great, it is difficult to complete the polarization process. This is because, as far as the polarization process mechanism by corona discharge is concerned, the charges that should have accumulated in the piezoelectric element via the pad section cannot entirely be accumulated in the piezoelectric element when a leak path is generated between the individual electrodes or between the individual electrode and the common electrode. As a result, it becomes difficult to complete the polarization process. In this regard, a preferable leak current amount between the individual electrodes or between the individual electrode and the common electrode when 50 V is applied is less than or equal to 1 E-8 A. More preferably, the leak current amount is less than or equal to 8 E-10 A.

If the leak current amount is greater than the value, the polarization process cannot be completed, so that it becomes difficult to obtain sufficient characteristics in displacement degradation after consecutive driving as the PZT piezoelectric actuator.

In the following, details of the material and the manufacturing (forming) of the elements of the electromechanical transducer element according to an embodiment are described.

Substrate 401

Figure 1:
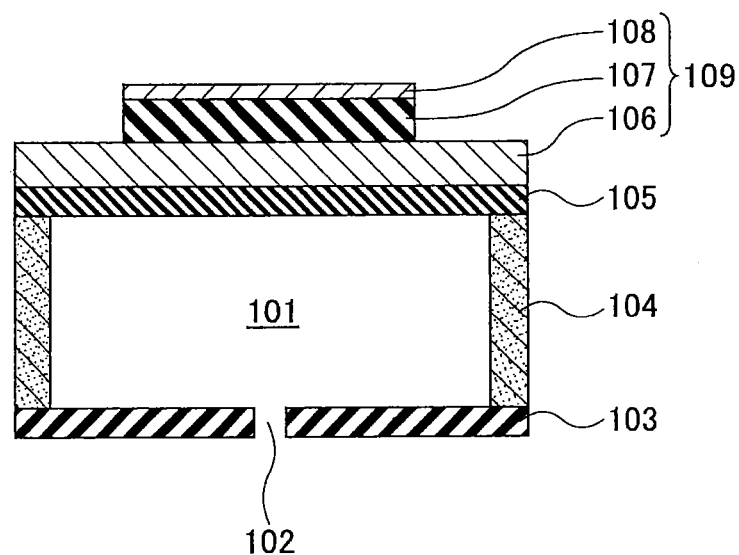
FIG. 1 schematically illustrates an example configuration of a liquid droplet discharge head.
Figure 2A:
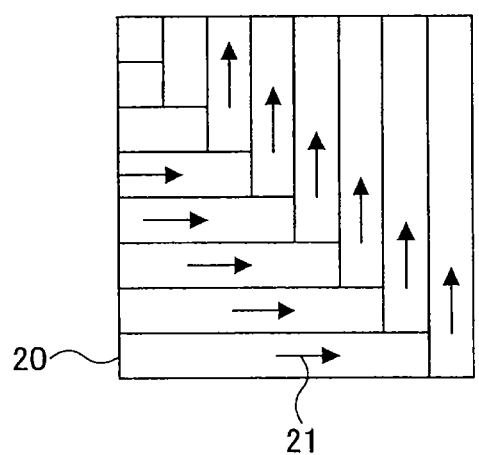
FIGS. 2A and 2B illustrate polarization states of a PZT membrane before and after a polarization process is performed, respectively.
Figure 2B:
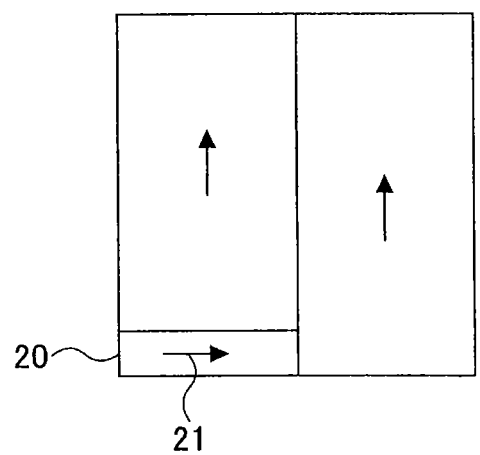

As the substrate 401, it is preferable to use a silicon monocrystal substrate. Preferably, the thickness of the substrate 401 is in a range from 100 μm to 600 μm. As the plane directions, there are three types: (100), (110), and (111). However, in the semiconductor industry, the plane directions (100) and (111) are widely used. In the embodiment, a monocrystal substrate having plane direction of (100) is mainly used. Further, when the compression chamber as illustrated in FIG. 1 is manufactured, a silicon monocrystal substrate is processed using etching. As the etching in this case, anisotropic etching is generally used.

Here, the "anisotropic etching" refers to etching using the characteristic that etching speed differs depending on the plane directions. For example, in the anisotropic etching by dipping into alkali solution such as KOH, the etching speed in (111) plane is approximately one four-hundredth of the etching speed in (100) plane. Therefore, in the plane direction (100), it is possible to form a structure having an inclination of approximately 54 degrees. On the other hand, it is possible for the plane direction (110) to form a deep groove. Therefore, in the plane direction (110), it is known that it is possible to increase layout density while maintaining the stiffness. In this regard, in this configuration, it is possible to use a monocrystal substrate having plane direction (110). However, in this case, $SiO_2$, which is a mask material, may also be etched. Therefore, care should be taken when the monocrystal substrate having plane direction (110) is used.

Membrane Vibration Plate 402

As illustrated in FIG. 1, by receiving the force generated by the electromechanical transducer membrane, the base (membrane vibration plate 402) is deformed and displaced so that ink droplets in the compression chamber are discharged. To that end, it is desired for the base to have a predetermined strength.

As a material of the membrane vibration plate 402, for example, a material formed from Si, $SiO_2$, and $Si_3N_4$ by a Chemical Vapor Deposition (CVD) method is used. Further, as the material of the membrane vibration plate 402, it is preferable to use a material having a linear expansion coefficient similar to those of the first electrode 403 and the electromechanical transducer membrane 404. Especially, as the electromechanical transducer membrane, PZT is generally used as the material. Therefore, as the linear expansion coefficient similar to the linear expansion coefficient of $8 \times 10^{-6}$ (1/K), it is preferable to use a material having the linear expansion coefficient in a range from $5 \times 10^{-6}$ to $10 \times 10^{-6}$. More preferably, a material having the linear expansion coefficient in a range from $7 \times 10^6$ to $9 \times 10^6$ is used.

As a specific material of the membrane vibration plate 402, aluminum oxide, zirconium oxide, iridium oxide, ruthenium oxide, tantalum oxide, hafnium oxide, osmium oxide, rhenium oxide, rhodium oxide, palladium oxide, and a compound thereof may be used. The membrane vibration plate 402 can be formed by a spin coater using a sputtering method or a Sol-gel method based on the material described above. Preferably, the film thickness of the membrane vibration plate 402 is in a range from 0.1 μm to 10 μm. More preferably, the film thickness of the membrane vibration plate 402 is in a range from 0.5 μm to 3 μm. When the film thickness of the membrane vibration plate 402 is less than the range, it becomes difficult to form the compression chamber. On the other hand, when the film thickness is greater than the range, it becomes difficult for the base to deform and be displaced so that ink droplet discharge becomes unstable.

First Electrode 403 and Sixth Electrode 413

It is preferable that the first electrode 403 and the sixth electrode 413 include metal or a metal electrode membrane and an oxide electrode membrane. Here, in order to prevent peel-off and the like, an adhesive layer is disposed between the vibration plate 402 and the metal or the metal electrode membrane.

In the following, details of the metal electrode membrane, the oxide electrode membrane, and the adhesive layer are described.

Adhesive Layer

After sputter deposition of Ti, Ti film was thermally-oxidized by using a rapid thermal annealing (RTA) device at the temperature range of 650° C. to 800° C. for one to thirty minutes in $O_2$ atmosphere to form a titanium oxide film. To form the titanium oxide film, a reactive sputtering method may be used. However, it is preferable to use a thermal oxidation method to heat a titanium film at a high temperature. When the reactive sputtering is used, it is necessary to heat a silicon substrate at a high temperature. Therefore, a special sputter chamber configuration becomes necessary. Further, better crystallinity of $TiO_2$ membrane can be obtained when oxidation is performed with the RTA device rather than when oxidation is performed with a general-purpose furnace. This is because, when oxidation is performed with a general-purpose heating furnace, a titanium membrane, which is easily-oxidizable, generates many crystalline structures at a low temperature. Therefore, it becomes necessary to destroy the crystalline structures once. In this regard, in order to form better crystallinity, it is advantageous to perform oxidation by using the RTA device having faster increasing temperature rate rather than a general-purpose heating furnace. Besides Ti as the material of the adhesive layer, Ta, Ir, Ru or the like may also be preferably used.

It is preferable that the membrane thickness of the adhesive layer is in a range of 10 nm to 50 nm, and it is more preferably that the membrane thickness is in a range of 15 nm to 30 nm. When the membrane thickness of the adhesive layer is less than the range, the adhesive force may become weak. On the other hand, when the membrane thickness of the adhesive layer is greater than the range, the crystalline quality of the electrode membranes to be formed on the adhesive layer may be degraded.

Metal Electrode Membrane

As a material of the metal electrode membrane, Pt, which has high heat resistance property and low reactive property, has been used. However, Pt may not have sufficient barrier properties against Pb. In this regard, a platinum group element such as iridium, platinum rhodium, etc., or an alloy membrane thereof may be used. Further, when Pt is used, due to poor adhesion with the base (especially with $SiO_2$), it is preferable that the adhesive layer is disposed first.

As a forming method of forming the metal electrode membrane, a vacuum film formation such as a sputtering method and a vacuum vapor deposition method is generally used. It is preferable that the membrane thickness of the metal electrode membrane is in a range of 80 nm to 200 nm, and it is more preferably that the membrane thickness is in a range of 100 nm to 150 nm. When the membrane thickness is less than the range, it becomes difficult to supply sufficient current as the common electrode, so that a failure may occur when ink droplets are discharged (ejected). On the other hand, when the membrane thickness of the adhesive layer is greater than the range, the cost is accordingly increased especially when an expensive platinum group element is used therein. Further, when the membrane thickness of the adhesive layer is greater than the range and Pt is used as the material thereof, the surface roughness of the metal electrode membrane is increased as the membrane thickness is increased. The increase of the surface roughness of the metal electrode membrane may influence the surface roughness and the crystalline orientation characteristics of the oxide electrode membrane and PZT to be formed thereon, so that a failure may occur such that sufficient displacement to discharge ink droplets cannot be obtained.

Oxide Electrode Membrane

For example, the material of the oxide electrode membrane greatly influences the crystalline growth as the seed layer of the electromechanical transducer membrane which is to be formed on the oxide electrode membrane. For example, when PZT is used as the electromechanical transducer membrane, the state of the crystalline orientation in the PZT greatly varies depending on the type (material) of the oxide electrode membrane. As specific examples, in order to promote PZT (111) orientation, it is preferable to use, for example, $SrRuO_3$ as a material of the oxide electrode membrane. On the other hand, in order to promote PZT (100) orientation, it is preferable to use, for example, $LaNiO_3$ as a material of the oxide electrode membrane. Further, based on the range of the membrane thickness of the thermally-oxidized $TiO_x$ seed, it becomes possible to arbitrarily adjust the PZT (100) orientation and the PZT (111) orientation. However, note that the material of the oxide electrode membrane is not limited to those materials. Regardless of whether the PZT (111) orientation or PZT (100) orientation is preferentially achieved, it is possible to keep a stable state as illustrated in FIGS. 15A and 15B by finally performing (completing) the polarization process. However, as far as the processing time is concerned, it is advantageous in a viewpoint of process tact to put a priority on the PZT (111) orientation.

Here, to make it possible to preferentially achieve the PZT (111) orientation, $SrRuO_3$ is selected as the material of the oxide electrode membrane, and details of the forming method are described. Here, it is assumed that "$SrRuO_3$" includes the material described as "$Sr_x(A)_{(1-x)}Ru_y(B)_{(1-y)}$", where "A=Ba or Ca", "B=Co or Ni", and "x,y=0 to 0.5". As the film forming method, the sputtering method is used. Although the membrane quality of $SrRuO_3$ thin membrane varies depending on the sputtering conditions, in order to place high value on the crystalline orientation property and make it possible to achieve (111) orientation in the $SrRuO_3$ membrane similar to the Pt (111) orientation in the first electrode, it is preferable that the substrate is heated at a temperature of 500° C. or more as the film forming temperature.

For example, Japanese Patent No. 3782401 discloses that, as the SRO film forming condition, after the film is formed at room temperature, the film is thermally-oxidized at the crystallization temperature (650° C.) by RTA process. In this case, it is possible to obtain a well-crystallized SRO membrane having sufficient resistivity value as the electrode. However, as the crystalline orientation property, the SRO membrane becomes more likely to achieve (110) orientation and the PZT, which is formed on the SRO membrane, also becomes more likely to achieve (110) orientation.

In the SRO crystalline formed on the Pt(111), Pt and SRO have close lattice constants. Therefore, it is difficult to distinguish one from another because the 2θ position of SRO(111) is overlapped with the 2θ position of Pt(111) in a usual θ-2θ measurement. For Pt, diffraction lines are canceled at a position where 2θ inclined by Psi=35 degrees is near about 32 degrees because of an extinction rule and a diffraction intensity cannot be found. Therefore, based on the peak intensity where Psi direction is inclined by approximately 35 degrees and 2θ is approximately 32 degrees, it becomes possible to determine whether SRO (111) orientation is preferentially achieved.

Figure 21:
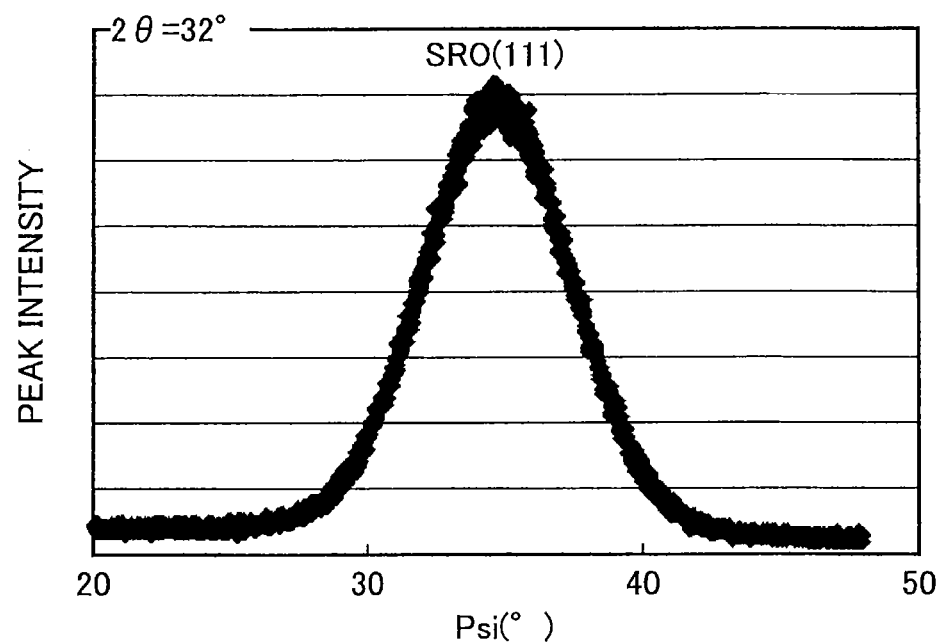
FIG. 21 illustrates an example XRD pattern of an SRO membrane (111) in an electromechanical transducer element according to an embodiment.

FIG. 21 illustrates data when 2θ is fixed to 32 degrees and Psi is changed. When Psi=0 degrees, the diffraction intensity of SRO(110) can hardly be observed. When Psi=35 degrees, the diffraction intensity of SRO(110) is observed. Accordingly, it is confirmed that the SRO formed based on the film forming conditions described above has the (111) orientation. Further, in the SRO in which the film is formed at room temperature and RTA process is done as described above, the diffraction intensity of the SRO (110) orientation is observed when Psi=0 degrees.

Although details are described below, after the SRO membrane is consecutively operated as the piezoelectric actuator, the degradation of the displace amount of the SRO membrane after the consecutive operations in comparison with the initial displacement is evaluated. As a result, the degradation is greatly influenced by the PZT orientation. In a case of the (110) orientation, it is not sufficient to prevent the degradation of the displacement amount. Further, when the surface roughness of the SRO membrane is observed, it is observed that the surface roughness of the SRO membrane varies depending on the film forming temperature. Specifically, when the film forming temperature is in a range of room temperature to 30° C., the surface roughness becomes very small, less than or equal to 2 nm. As for the roughness, the surface roughness (average roughness) measured by an Atomic Force Microscope (AFM) is used as the index. As the data of the surface roughness of the SRO membrane, the surface roughness is very flat. However, the crystalline-state of the SRO membrane is not sufficient because it is not possible to obtain sufficient characteristics in the initial displacement as the PTF, which is to be formed afterward, as the piezoelectric actuator and the degradation of the displacement amount after consecutive operations. It is preferable that the surface roughness of the SRO membrane is in a range of 4 nm to 15 nm. More preferably, the surface roughness is in a range of 6 nm to 10 nm. When the surface roughness is greater than the range, the dielectric strength voltage of the PZT formed afterward becomes remarkably poor, so that leakage is more likely to occur. Therefore, in order to obtain the crystalline property and surface roughness, the film forming temperature is in a range of 500° C. to 700° C. Preferably, the film forming temperature is in a range of 520° C. to 600° C.

The preferable composition ratio of Sr and Ru (Sr/Ru) after film forming is greater than or equal to 0.82 and less than equal to 1.22. If the "Sr/Ru" is out of the range, the resistivity becomes greater and it becomes difficult to have sufficient conductive property as the electrode.

The preferable membrane thickness of the SRO membrane is in a range of 40 nm to 150 nm. More preferably, the membrane thickness is in a range of 50 nm to 80 nm. When the membrane thickness is less than the range, it becomes difficult to have sufficient characteristics in the initial displacement and the degradation of the displacement amount after consecutive operation and also it becomes difficult to obtain a function as a stop etching layer to control the overetching of the PZT. On the other hand, when the membrane thickness is greater than the range, the dielectric strength voltage of the PZT formed afterward becomes remarkably poor, so that leakage is more likely to occur.

The preferable resistivity of the SRO membrane is less than or equal to $5 \times 10^{-3}$ Ω·cm. More preferably, the resistivity is less than or equal to $1 \times 10^{-3}$ Ω·cm. When the resistivity of the SRO membrane is greater than the range, it becomes difficult to obtain sufficient contact resistance at the surface boundary with the fifth electrode 410 as the common electrode and it becomes difficult to supply sufficient current as the common electrode, so that a failure occurs when ink droplets are discharged.

Electromechanical Transducer Membrane 404

As a material of the electromechanical transducer membrane 404, PZT is mainly used. The "PZT" refers to a solid solution comprising lead zirconate ($PbZrO_3$) and lead titanate ($PbTiO_3$), and the characteristics of the PZT varies depending on the ratio of lead zirconate to lead titanate. The composition between lead zirconate ($PbZrO_3$) and lead titanate ($PbTiO_3$), usually indicating excellent piezoelectric property is in a ratio of 53:47, which is described as $Pb(Zr_{0.53}Ti_{0.47})O_3$ in chemical formula and is also described as "PZT(53/47)". As a compound oxide other than PZT, barium titanate may be used as the material of the electromechanical transducer membrane 404. In this case, barium alkoxide and titanium alkoxide compound as starting materials may be dissolved in a common solvent to prepare a barium titanate precursor solution.

Those materials are described in a general formula $ABO_3$ where A=Pb, Ba, or Sr, B=Ti, Zr, Sn, Ni, Zn, Mg, or Nb as the main materials of the compound oxide. In more specific formulas, there are, for example, $(Pb_{1-x}Ba_x)(Zr,Ti)O_3$ and $(Pb_{1-x}$ Sr$_x$) (Zr,Ti)O$_3$ where "Pb" in A site is partially substituted by "Ba" and "Sr". Such substitution can be done in a case of a bivalent element. The effect of the substitution is to reduce the degradation of the characteristics caused by Pb-evaporation during a heating process.

As a forming method of forming the PZT, a sputtering method or a Sol-gel method with a spin coater is used. In this case, a patterning process is necessary. To that end, a desired pattern is formed by photolithography and etching, etc.

When the PZT is formed by the Sol-gel method, lead acetate, zirconium alkoxide, and titanium alkoxide compound as starting materials may be dissolved in methoxyethanol as a common solvent to acquire a homogeneous solution to prepare a PZT precursor solution. A metal alkoxide compound is susceptible to hydrolysis with moisture in the air. Therefore, as stabilizer, an appropriate amount of acetylacetone, acetic acid, diethanolamine or the like may be added to the PZT precursor solution.

When the PZT membrane is to be acquired on the entire surface of the base substrate, a coated film is formed by a solution application method such as spin coating. Then, the coated film is heated by heating processes for drying solvent, thermal decomposition, and crystallization. In the transformation from the coated film to the crystallized film, volume contraction also occurs. In order to obtain a crack-free membrane, it is desired to adjust the precursor density so that the PZT membrane having the membrane thickness of 100 nm or less can be formed within one process.

Preferably, the membrane thickness of the electromechanical transducer membrane is in a range of 0.5 μm to 5 μm. More preferably, the membrane thickness is in a range of 1 μm to 2 μm. If the membrane thickness is less than the range, it becomes difficult to cause (provide) sufficient displacement. On the other hand, if the membrane thickness is greater than the range, the number of processes to laminate some thin layers is increased and the processing time period is also increased.

Further, it is preferable that the insulation resistance of the electromechanical transducer membrane is greater than or equal to $5.0 \times 10^{10} \Omega$.

Further, it is preferable that the relative permittivity of the electromechanical transducer membrane is greater than or equal to 600 and less than or equal to 2000. More preferably, the relative permittivity is greater than or equal to 1200 and less than or equal to 1600. If the relative permittivity of the electromechanical transducer membrane is less than 600, a failure may occur so that it becomes impossible to obtain sufficient displacement characteristic. On the other hand, if relative permittivity is greater than 2000, a failure may occur so that, for example, the polarization process cannot be sufficiently performed so that it becomes difficult to acquire sufficient characteristics to prevent the degradation of the displacement after consecutive operations.

Second Electrode 405

It is preferable that the second electrode 405 is made of a metal or a oxide material and a metal.

In the following, details of an oxide electrode membrane (film) and a metal electrode membrane are described.

Oxide Electrode Membrane

As the material and the like of the oxide electrode membrane, the similar material and the like of the oxide electrode membrane used in the first electrode 403 can be used. It is preferable that the membrane thickness of the SRO membrane is in a range of 20 nm to 80 nm. More preferably, the membrane thickness is in a range of 40 nm to 60 nm. If the membrane thickness is less than the range, it becomes difficult to obtain sufficient characteristics in the initial displacement and to prevent the degradation of the displacement characteristic. On the other hand, if the membrane thickness is greater than the range, the dielectric strength voltage of the PZT formed afterward becomes remarkably poor, so that leakage is more likely to occur.

Metal Electrode Membrane

As the material and the like of the metal electrode membrane, a similar material and the like of the metal electrode membrane used in the first electrode 403 can be used. It is preferable that the membrane thickness is in a range of 30 nm to 200 nm. More preferably, the membrane thickness is in a range of 50 nm to 120 nm. If the membrane thickness is less than the range, it becomes difficult to supply sufficient current as the individual electrode so that a failure may occur when ink droplets are discharged. On the other hand, if the membrane thickness is greater than the range, the cost is accordingly increased especially when an expensive platinum group element is used therein. Further, when the membrane thickness is greater than the range and Pt is used as the material thereof, the surface roughness of the metal electrode membrane is increased as the membrane thickness is increased, so that a process failure may occur that the membrane is more likely to be peeled off when the sixth electrode 413 is formed via the insulation protection membrane.

First Insulation Protection Membrane 406

As a material of the first insulation protection membrane 406, in order to prevent the piezoelectric element from being damaged in the film forming and the etching processes, since it is desired to select a material through which moisture in the air is unlikely to pass, it is preferable to use a precise inorganic material. It is not preferable to use an organic material because the membrane thickness of the organic material is required to be greater to obtain sufficient protection performance. If the membrane thickness of the first insulation protection membrane 406 is greater, the first insulation protection membrane 406 remarkably prevents the membrane vibration plate 402 from being vibrated and displaced, thereby degrading the discharge performance of the ink droplets in the inkjet head.

As the material of the first insulation protection membrane 406, in order to obtain high protection performance with a thin membrane, it is preferable to use an oxide, a nitride, or a carbonized membrane. Further, it is also desired that the material of the first insulation protection membrane 406 has higher adhesiveness to the electrode material, the piezoelectric material, and the vibration plate material which become a base of the first insulation protection membrane 406. Furthermore, it is desired to select the membrane forming method of forming the first insulation protection membrane 406, in which the piezoelectric element is not damaged when the membrane forming method is performed. Namely, it is not preferable to use a Plasma CVD method in which reactive gas is made into plasma and deposited on the substrate and a sputtering method in which a membrane is formed by colliding plasmas to a target material to fly off the target material. In this regard, as preferable membrane forming methods, there are an evaporation method and an Atomic Layer Deposition (ALD) method. However, it is preferable to use the ALD method because it is possible to widely select a material to be used. As a preferable material of the first insulation protection membrane 406, there is, for example, an oxide membrane to be used in a ceramic material such as, for example, $AlO_2$, $ZrO_2$, $Y_2O_3$, $TiO_2$, etc. Especially, by using the ALD method, it becomes possible to form a thin membrane having extremely high membrane density and prevent damage to the membrane (material) during the process.

It is desired that the membrane thickness of the first insulation protection membrane 406 is thick enough to protect the piezoelectric element and it is also desired that the membrane thickness of the first insulation protection membrane 406 is thin as much as possible so as not to prevent the displacement of the membrane vibration plate 402. In this regard, it is preferable that the membrane thickness of the first insulation protection membrane 406 is in a range of 20 nm to 100 nm. If the membrane thickness is greater than 100 nm, the displacement amount of the membrane vibration plate 402 is reduced, thereby reducing the discharge efficiency of the inkjet head. On the other hand, if the membrane thickness is less than 20 nm, the function to protect the piezoelectric element as the protection layer becomes insufficient, thereby reducing the performance of the piezoelectric element as described above.

Further, it is thought that two layers of the first insulation protection membrane 406 are formed. In this case, the thickness of the second layer of the insulation protection membrane is greater. However, it is also desired not to remarkably prevent the vibration/displacement of the membrane vibration plate 402. To that end, for example, an opening may be formed near the second electrode 405 in the second layer of the insulation protection membrane. In this case, as the material of the second layer of the insulation protection membrane, not only an arbitrary oxide, nitride, carbide or an complex compound thereof but also $SiO_2$, which is usually used in a semiconductor device, may be used. As a membrane forming method, any appropriate method may be used such as, for example, a CVD method, or a sputtering method. However, when the uneven coating in the pattern forming section of the electrode forming sections and the like is a concern, it is preferable to use the CVD method. Further, it is desired that the membrane thickness of the second layer of the insulation protection membrane is great enough so as not to cause an insulation breakdown by the voltage applied between the lower electrode 106 and an individual electrode wiring. Namely, it is desired to set the electric field intensity applied to the second layer of the insulation protection membrane in a range so as not to cause the insulation breakdown. Further, when a surface characteristic and a pinhole of the base of the insulation protection membrane is a concern, it is preferable that the membrane thickness is greater than or equal to 200 nm. More preferably, the membrane thickness is greater than or equal to 500 nm. Third electrode 407, fourth electrode 408, and fifth electrode 410

As the material of the third electrode 407, the fourth electrode 408, and the fifth electrode 410, it is preferable to use a metal electrode material made of one of Ag alloy, Cu, Al, Au, Pt, and Ir. As the forming method, a sputtering method or a spin coat method is used. Then, by photolithography and etching, a desired pattern is obtained. It is preferable that the membrane thickness thereof is in a range of 0.1 μm to 20 μm. More preferably, the membrane thickness thereof is in a range of 0.2 μm to 10 μm. If the membrane thickness is less than the range, the resistance becomes greater and it becomes difficult to flow sufficient current to the electrode, so that the discharge of ink droplets of the inkjet head becomes unstable. On the other hand, if the membrane thickness is greater than the range, the processing time becomes longer. Further, it is preferable that the contact resistance values at the contact hole sections (e.g., 10 μm by 10 μm) as the common electrode and the individual electrode are less than 10Ω and less than 1Ω, respectively. More preferably, the contact resistance values as the common electrode and the individual electrode are less than 5Ω and less than 0.5Ω, respectively. If the contact resistance value exceeds the range, it becomes difficult to supply sufficient current, so that a failure occurs when ink droplets are discharged.

Second Insulation Protection Membrane 409

The function of the second insulation protection membrane 409 is to serve as a passivation layer having the function as a protection layer to protect an individual electrode wiring and a common electrode wiring. As illustrated in FIGS. 5A through 5C, the individual electrode and the common electrode except an individual electrode lead section (i.e., above the individual electrode pad 411) and a common electrode lead section (i.e., above the common electrode pad 412) are coated. By doing this, it becomes possible to use an inexpensive Al material or an alloy material including Al as a main component as a material of the electrodes. As a result, it becomes possible to reduce the cost and provide an inkjet head having a higher reliability.

As a material of the second insulation protection membrane 409, it is possible to use an arbitrary inorganic material or an organic material. However, it is desired to use a material having a lower moisture permeability. The inorganic material includes, for example, oxide, nitride, and carbide. The organic material includes, for example, polyimide, acrylate resin, and urethane resin. However, when the organic material is used, the membrane has to be a thick membrane. Therefore, it is not suitable for the patterning described below. Due to this, it is preferable to use an inorganic material so as to make it possible to provide a wiring protection function with a thinner membrane. Especially, it is preferable to use $Si_3N_4$ on the Al wirings because this is a proven technique used in the semiconductor devices.

Further, it is preferable that the membrane thickness of the second insulation protection membrane 409 is greater than or equal to 200 nm. More preferably, the membrane thickness is greater than or equal to 500 nm. If the membrane thickness is less than the range, it becomes difficult to provide a sufficient passivation function, so that the wiring material may be cut due to corrosion of the wiring material, thereby degrading the reliability of the inkjet head.

Further, it is preferable to have a structure in which a thin membrane section (not shown) on the piezoelectric element and on the vibration plate near the piezoelectric element. For example, in FIGS. 8A through 8C, it is preferable that the membrane thickness of the second insulation protection membrane 409 on the electromechanical transducer membrane 404 (the second electrode 405) and on a position excluding the area where the fourth electrode 408 is disposed is greater than the membrane thickness of the second insulation protection membrane 409. This is the same reason that the membrane thickness of the first insulation protection membrane 406 is reduced in an individual liquid chamber area of the first insulation protection membrane 406. By doing this, it becomes possible to provide an inkjet head having a higher efficiency and a higher reliability.

To form an opening part, a photolithography method and a dry etching method can be used. This is because the piezoelectric element is protected by the insulation protection membrane. Further, it is preferable that the area of the pad sections is greater than or equal to 50×50 μm². More preferably, the area of the pad sections is greater than or equal to 100×300 μm². If the area is less than the range, a failure may occur so that it becomes difficult to sufficiently perform the polarization process and it also becomes difficult to acquire sufficient characteristics to prevent the degradation of the displacement after consecutive operations.

Second Embodiment of the Electromechanical Transducer Element

Next, details of the electromechanical transducer element according to the second embodiment are described.

In this embodiment, in place of the end part individual electrode pad described in the first embodiment, a structure is provided for reducing the charge concentration in the separated individual electrode pad described in detail below.

Here, the configuration of FIG. 4 in this embodiment (the laminated layer structure) is the same as that of the first embodiment. Namely, in this embodiment, the same configuration as that in the first embodiment is provided, including the substrate 401, the membrane vibration plate 402 as the base membrane, the first electrode 403, the electromechanical transducer membrane 404, and the second electrode 405, which are laminated in this order. Here, the element configuration further including the interlayer membrane and the lead wirings is described.

Here, to understand the present invention, before a configuration of the electromechanical transducer element according to the second embodiment is described, another example configuration of an electromechanical transducer element in related art is described. Note that the laminated configuration described with reference to FIG. 4 is similarly applied to the electromechanical transducer element according to the second embodiment and the electromechanical transducer element in another configuration example in related art.

Figure 22A:
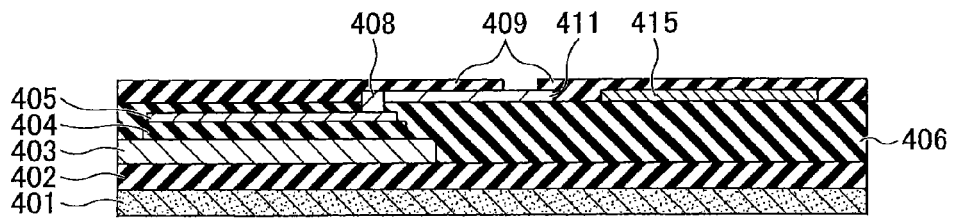
FIG. 22A is a cross-sectional view 1 of another example configuration of an electromechanical transducer element in related art.
Figure 22B:
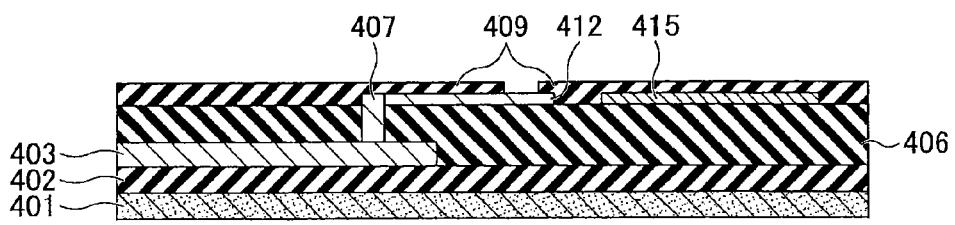
FIG. 22B is a cross-sectional view 2 of another example configuration of an electromechanical transducer element in related art.
Figure 22C:
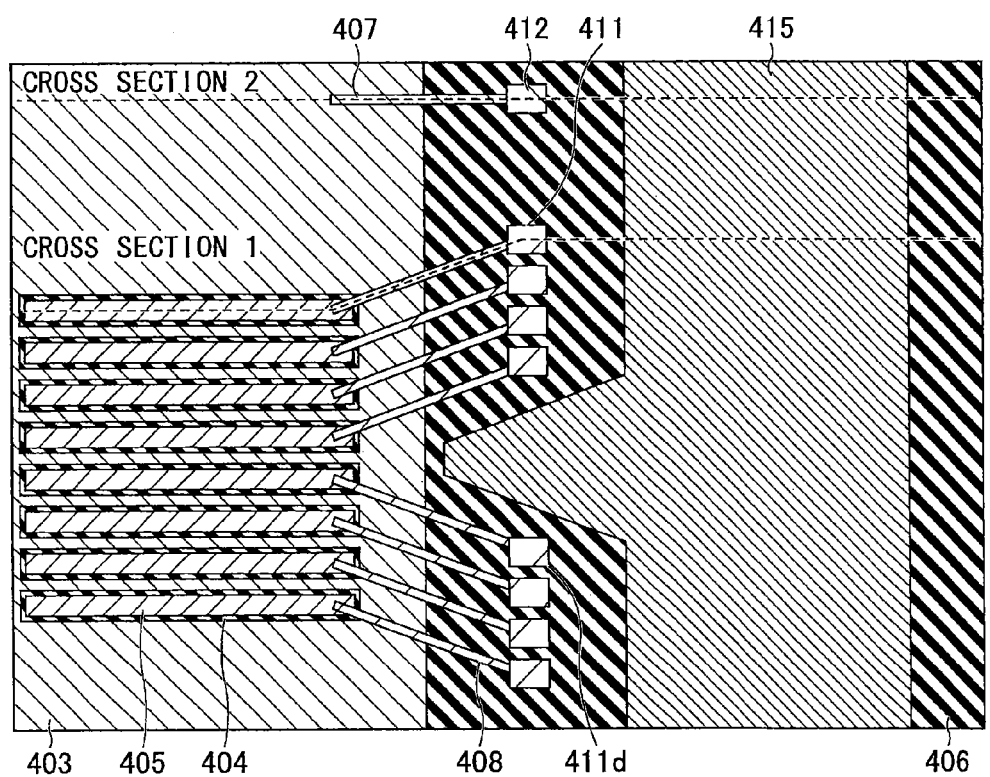
FIG. 22C is a top view of another example configuration of an electromechanical transducer element in related art.

FIG. 22A is a cross-sectional view 1 of another example configuration of an electromechanical transducer element in related art. FIG. 22B is a cross-sectional view 2 of another example configuration of an electromechanical transducer element in related art. FIG. 22C is a top view of another example configuration of the electromechanical transducer element in related art. In FIG. 22C, for explanatory purposes, descriptions of the second insulation protection membrane 409 and the first insulation protection membrane 406 formed on the first electrode 403 are omitted.

Further, in FIGS. 22A through 22C and the following description according to the second embodiment, the area where the drive voltage wire line 415 is formed is described for explanatory purposes (although the description of the area is omitted in the above first embodiment).

Further, a comparison is made between the configuration of the electromechanical transducer element in related art in FIGS. 5A through 5C and another configuration example of the electromechanical transducer element in related art in FIGS. 22A through 22C. Then, only different points therebetween are described and repeated descriptions may be omitted.

The drive voltage wire line 415 is provided in both the configuration of FIGS. 22A through 22C and the configuration in FIGS. 5A through 5C. However, the layout configuration thereof is different. In the configuration in FIG. 22C, similar to Japanese Patent No. 5233398 described above, the two ICs 416 (not shown) and a drive voltage wire line 415 for IC connection are arranged near the PAD for individual electrode, so that the distance between lead wirings is elongated, and two separated individual electrode pads 411d among the individual electrode pads 411 arranged in the line may be separated and arranged.

Further, as illustrated in FIG. 22C, the two center separated individual electrode pads 411d are usually separately disposed (at a separated part), and the same number of the individual electrode pads 411 are arranged in the predetermined line on each of the both sides sandwiching the separated part. In other words, an even number of the individual electrode pads 411 are arranged in the predetermined line, and only two separated individual electrode pads 411d disposed at the center of the individual electrode pads 411 are more separated from each other and any of the individual electrode pads 411 are separated from the adjacent individual electrode pads 411 by the same distance except the distance between the two individual electrode pads 411d.

However, the present invention described below is not limited to this configuration. For example, the number of the individual electrode pads 411 on one side of the separated part differs from the number of the individual electrode pads 411 on the other side of the separated part. Further, the number of the separated part is not limited to one. Namely, there may be two or more separated parts.

The same phenomenon as that of the polarization process by corona discharge described with reference to FIGS. 6 and 7 also occurs in the configurations in FIGS. 22A through 22C and FIGS. 5A through 5C as well.

Namely, in a case where the piezoelectric elements are arranged in the predetermined line as illustrated in FIGS. 22A through 22C, when the polarization process is performed by charge injection by corona discharge or the like, charges are concentrated in the drive channel individual electrode section adjacent to the separated section in the line (i.e., the separated individual electrode pad). Due to the charge concentration, the inventors of the present invention have found that a failure occurs such as a variation in characteristics in the line by excessive progression of the polarization process and insulation breakdown between upper and lower electrodes due to excessive charge injection.

Figure 23A:
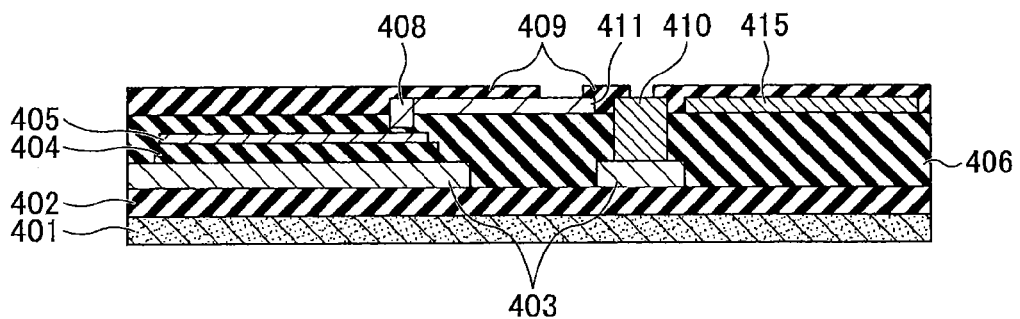
FIG. 23A is a cross-sectional view of an electromechanical transducer element according to a second embodiment.
Figure 23B:
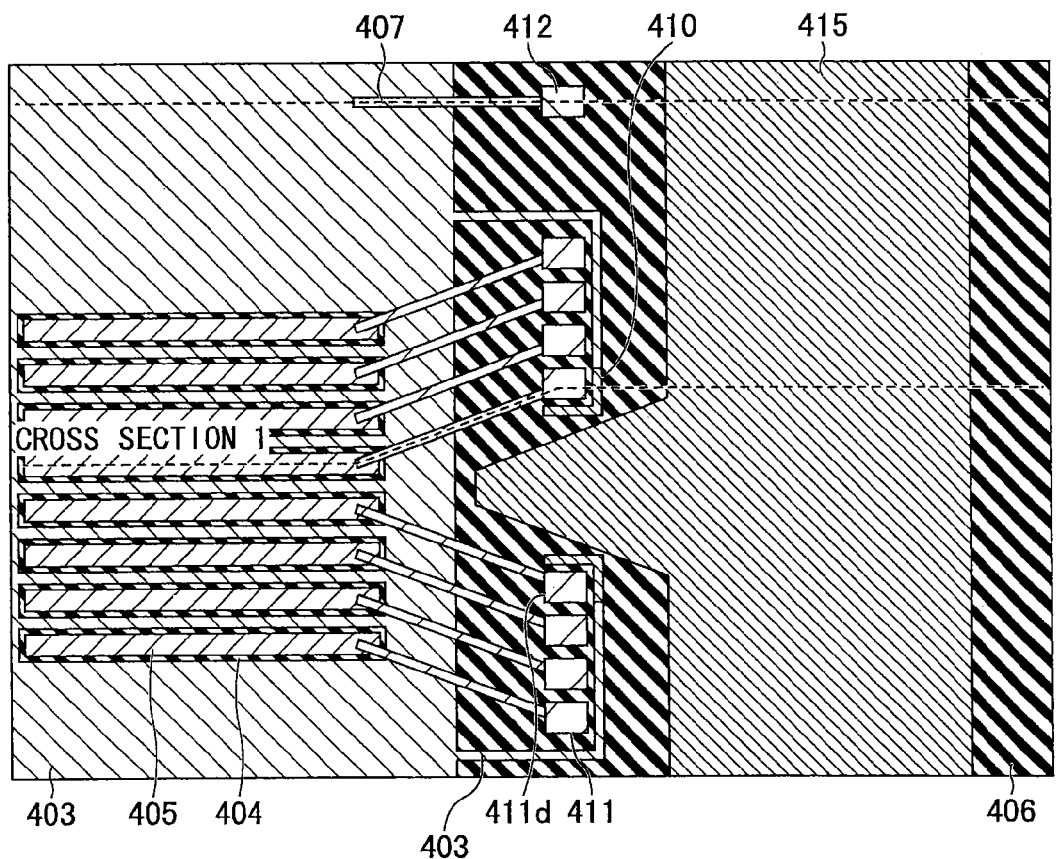
FIG. 23B is a top view of an electromechanical transducer element according to the second embodiment.

To resolve the problems, the fifth electrodes 410 are formed so as to surround the vicinity of the respective separated individual electrode pads 411d which are more separated from each other than any other individual electrode pads 411 separated from the corresponding adjacent individual electrode pads 411. More specifically, in order to prevent the charge concentration into the separated individual electrode pads 411d, as illustrated in FIGS. 23A and 23B, the electrodes having an L-shape (fifth electrodes 410) are formed in a manner such that the electrodes surround only the vicinities of the corresponding separated individual electrode pads 411d, so that excessive charges can be injected into the electrodes (fifth electrodes 410) surrounding the vicinities of the separated individual electrode pads 411d. More detail of the shape of the fifth electrodes 410 is that one side of the L-shape of the fifth electrodes 410 is disposed on the end surface side (the separated part side) of the corresponding separated individual electrode pad 411d (but the one side of the fourth electrode 408 is not included), so as to surround the vicinities of the separated individual electrode pads 411d. However, it should be noted that the shape of the fifth electrode 410 is not limited to the L-shape.

FIG. 23A is a cross-sectional view of an electromechanical transducer element according to the second embodiment. FIG. 23B is a top view of an electromechanical transducer element according to the second embodiment. In FIG. 23B, for explanatory purposes, descriptions of the second insulation protection membrane 409 and the first insulation protection membrane 406 formed on the first electrode 403 are omitted.

The fifth electrode 410 is formed on the first insulation protection membrane 406 and is electrically connected to the first electrode 403 through a contact hole. On the fifth electrode 410, the second insulation protection membrane 409 is formed. However, an opening having an L shape is formed to surround the vicinity of the individual electrode pad 411.

Further, on the first electrode 403 which is electrically connected to the fifth electrode 410, the first insulation protection membrane 406 is formed. In FIGS. 23A and 23B, on the first electrode 403 which is formed both in a rectangular shape and in a part formed like a lead line as well, the first insulation protection membrane 406 (or a contact hole) is formed.

Further, the width of the fifth electrode 410 and the layout relationship between the opening part 414a which is an opening area of the second insulation protection membrane 409 formed on the fifth electrode 410 and the opening part 414b formed on the separated individual electrode pads 411d are similar to those in the first embodiment. Details of these are described below.

Further, in this embodiment, as illustrated in FIG. 23B, the drive voltage wire line 415 for IC connection is disposed near the second electrode 405, particularly near the fourth electrode 408.

It is preferable that the diameter of the drive voltage wire line 415 is thick as much as possible.

Further, as illustrated in FIG. 23B, in the layout relationship between the second electrode 405 and the individual electrode pads 411, the lines between the second electrodes 405 and the corresponding individual electrode pads 411 are not parallel to and are inclined (with an angle) relative to the longitudinal direction of the electromechanical transducer membrane 404. By having such a layout relationship, it becomes possible to thicken (widen) the fourth electrode 408 connecting between the second electrode 405 and the individual electrode pad 411 as much as possible. Namely, by thickening the fourth electrode 408 so as not to be in contact with other fourth electrode 408 and the like, it becomes possible to increase the wiring area and reduce the volume resistance.

Next, the width of the fifth electrode 410 and the layout relationship between the opening part 414a which is an opening area of the second insulation protection membrane 409 formed on the fifth electrode 410 and the opening part 414b formed on the separated individual electrode pads 411d are described with reference to FIG. 24.

In this embodiment as well, it is preferable that the width of the fifth electrode 410 is greater than or equal to 20 μm and is less than or equal to 100 μm.

Figure 24:
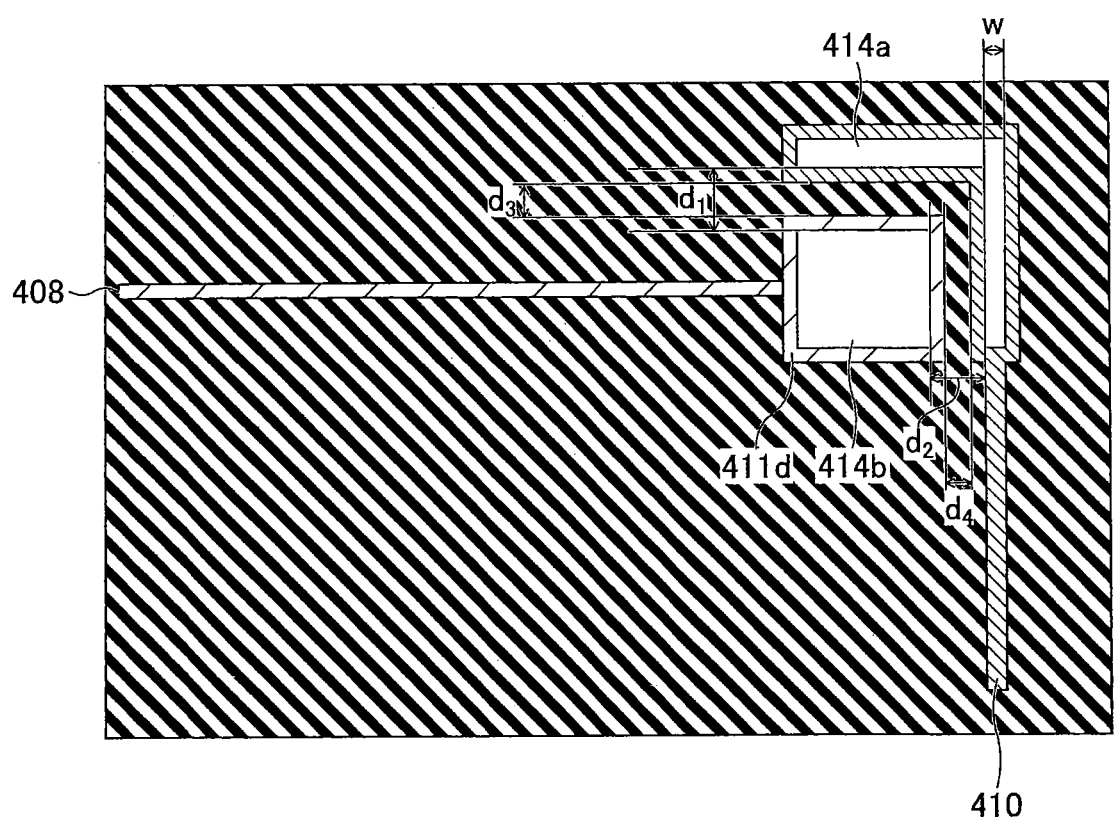
FIG. 24 illustrates a layout relationship between openings of a second insulation protection membrane according to the second embodiment.

Further, as illustrated in FIG. 24, the layout relationship between the opening part 414a and the opening part 414b becomes important. Here, the opening part 414a is an opening region of the second insulation protection membrane 409 formed on the fifth electrode 410, and the opening part 414b is an opening region formed on the separated individual electrode pad 411d. Here, the distances "$d_1$" and "$d_2$" are defined as the distances between the opening part 414b, which is the opening region formed on the separated individual electrode pad 411d and the opening part 414a, which is the opening region formed so as to surround the vicinity of the separated individual electrode pad 411d as illustrated in FIG. 24. In this case, it is preferable that the distances "$d_1$" and "$d_2$" (FIG. 24) are greater than or equal to 5 μm and less than or equal to 50 μm. More preferably, the distances "$d_1$" and "$d_2$" are greater than or equal to 6 μm and less than or equal to 20 μm. Namely, if the distances "$d_1$" and "$d_2$" are less than the range, charges are concentrated in (the vicinity of) the fifth electrode 410, so that charges are unlikely to be accumulated in (the vicinity of) the separated individual electrode pad 411d. As a result, it becomes difficult to achieve (promote) the polarization. On the other hand, if the distances "$d_1$" and "$d_2$" are greater than the range, most charges are accumulated in (the vicinity of) the separated individual electrode pad 411d, so that it becomes difficult for the fifth electrode 410 to sufficiently accumulate excessive charges.

Further, as illustrated in FIG. 24, the opening width "w" of the opening part 414a (white part) which is the opening region of the second insulation protection membrane 409 formed on the fifth electrode 410 becomes important. It is preferable that the opening width "w" (FIG. 24) is greater than or equal to 10 μm. More preferably, the opening width "w" is greater than or equal to 20 μm. If the opening width "w" is less than the value, most charges are concentrated in the separated individual electrode pad 411d, so that it becomes difficult for the fifth electrode 410 to sufficiently accumulate excessive charges. Also, the opening width "w" is less than or equal to 80 μm.

Further, the distances "$d_3$" and "$d_4$" are defined as the distances between the electrode part, which is formed so as to surround the vicinity of the separated individual electrode pad 411d (L-shaped part in FIG. 24), and separated individual electrode pad 411d as illustrated in FIG. 24. In this case, it is preferable that the distances "$d_3$" and "$d_4$" are greater than or equal to 3 μm and less than or equal to 50 μm. Namely, if the distances "$d_3$" and "$d_4$" are less than the range, charges are concentrated in the fifth electrode 410, so that charges are unlikely to be accumulated in the separated individual electrode pad 411d. As a result, it becomes difficult to achieve (promote) the polarization. On the other hand, if the distances "$d_3$" and "$d_4$" are greater than the range, most charges are accumulated in the separated individual electrode pad 411d, so that it becomes difficult for the fifth electrode 410 to sufficiently accumulate excessive charges.

Electromechanical Transducer Element of Modified Example 1 in Second Embodiment

Figure 25:
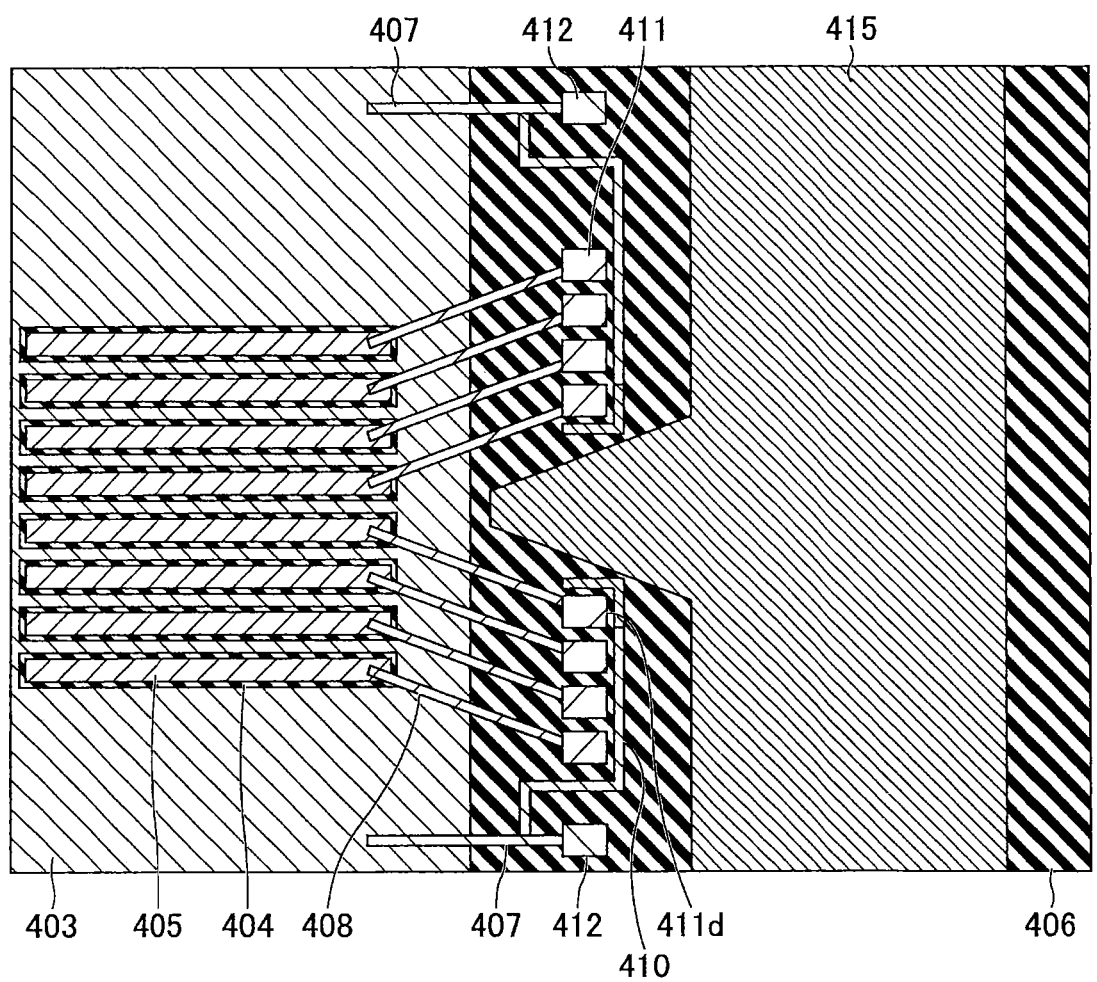
FIG. 25 is a top view of another example configuration of an electromechanical transducer element according to the second embodiment.

FIG. 25 is a top view of another example configuration of an electromechanical transducer element according to the second embodiment. In FIG. 25 as well, for explanatory purposes, descriptions of the second insulation protection membrane 409 and the first insulation protection membrane 406 formed on the first electrode 403 are omitted.

As illustrated in FIG. 25, the fifth electrode 410 may have a pattern figure so as to be electrically connected to the third electrode 407.

Further, in the configuration of FIG. 25, it is preferable that the part of the fifth electrode 410, which is parallel to the arranging direction of the individual electrode pads 411, is also parallel in the layout relationship with the separated individual electrode pads 411d.

Electromechanical Transducer Element of Modified Example 2 in Second Embodiment

Figure 26:
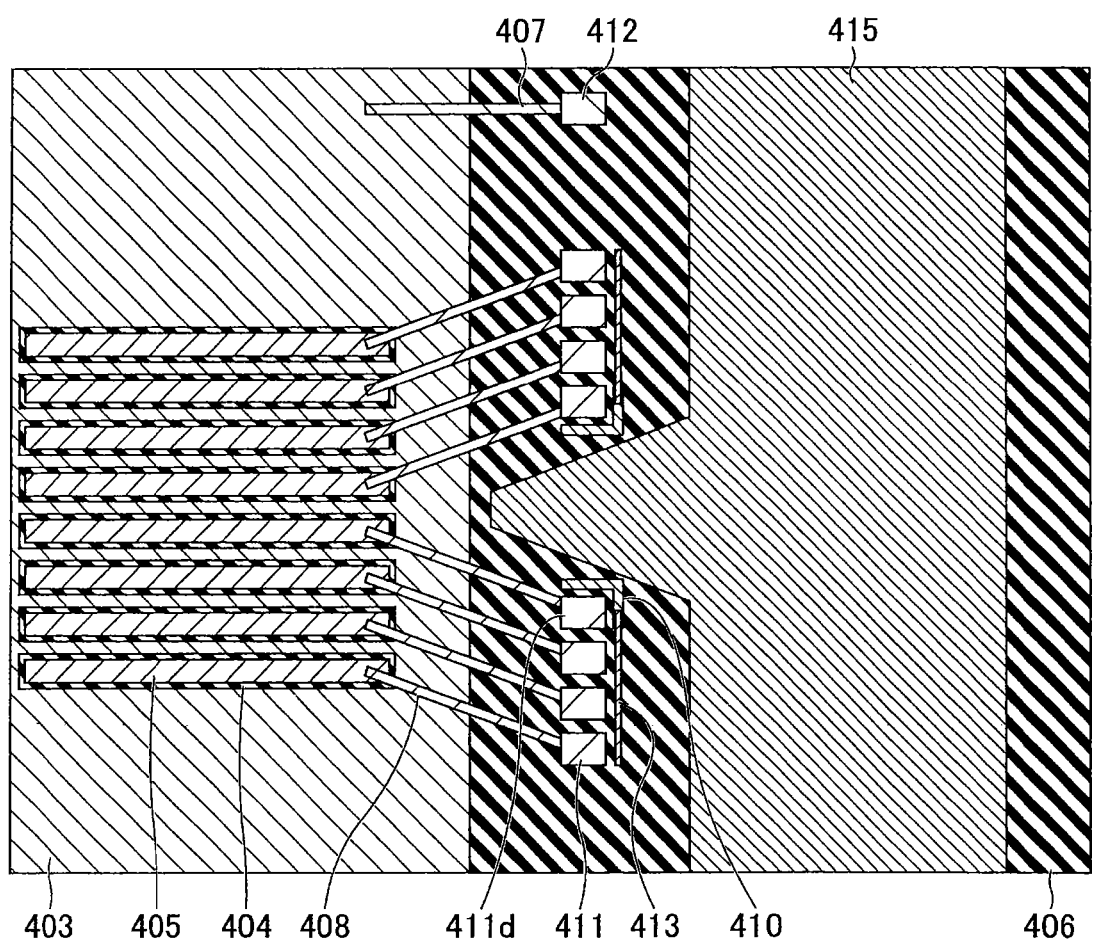
FIG. 26 is a top view of still another example configuration of an electromechanical transducer element according to the second embodiment.

Further, as illustrated in FIG. 26, the fifth electrode 410 may have a pattern figure so as to be electrically connected to the sixth electrode 413 which is independently formed on the substrate 401 or the base membrane besides the first electrode 403. Here, FIG. 26 is a top view of still another example configuration of an electromechanical transducer element according to the second embodiment. In FIG. 26, for explanatory purposes, descriptions of the first insulation protection membrane 406 formed on the second insulation protection membrane 409, the first electrode 403, and the sixth electrode 413 are omitted. The inventors of the present invention have confirmed that the same effect as that in the pattern shape as illustrated in FIGS. 23A, 23B and 25 is obtained by flowing excessive charges, by corona polarization process, to the GND via the fifth electrode 410, the membrane vibration plate 402 under the sixth electrode 413, and the substrate 401.

The electromechanical transducer element according to the first embodiment described above includes the fifth electrode 410 having the L-shape so as to surround only the vicinity of the individual electrode pads 411c in the edge part. On the other hand, the electromechanical transducer element according to the second embodiment described above includes the fifth electrode 410 having the L-shape so as to surround only the vicinity of the separated individual electrode pads 411d. However, the present invention is not limited to those configurations. For example, the fifth electrode 410 having the L-shape may be formed in the vicinity of the individual electrode pads 411c in the edge part and in the vicinity of the separated individual electrode pads 411d.

Liquid Droplet Discharge Head and Liquid Droplet Discharge Device

Next, an example of an inkjet recording device (liquid droplet discharge device) having an inkjet head (liquid droplet discharge head) according to an embodiment is described.

Figure 17:
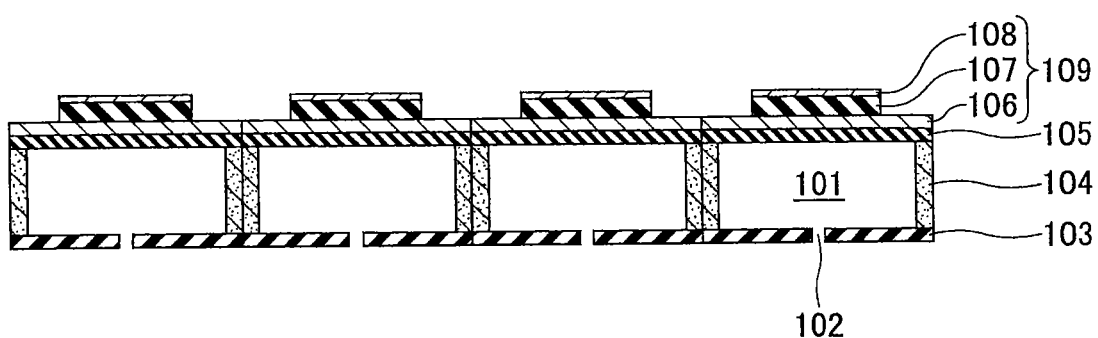
FIG. 17 schematically illustrates an another example configuration of the liquid droplet discharge head.

FIG. 1 illustrates a liquid droplet discharge head having one nozzle. FIG. 17 illustrates a liquid droplet discharge head having plural nozzles (i.e., another configuration of the liquid droplet discharge head). According to an embodiment, it is possible to form the electromechanical transducer element as illustrated in the figures by a simplified fabrication process (also having a performance similar to that of bulk ceramics). After that, it is also possible to form the liquid droplet discharge head according to an embodiment by etching removal from the rear surface to form the compression chamber and bonding a nozzle plate having nozzle holes. In the figures, the descriptions of a liquid supply means, a flow path, and a fluid resistance are omitted.

Figure 18:
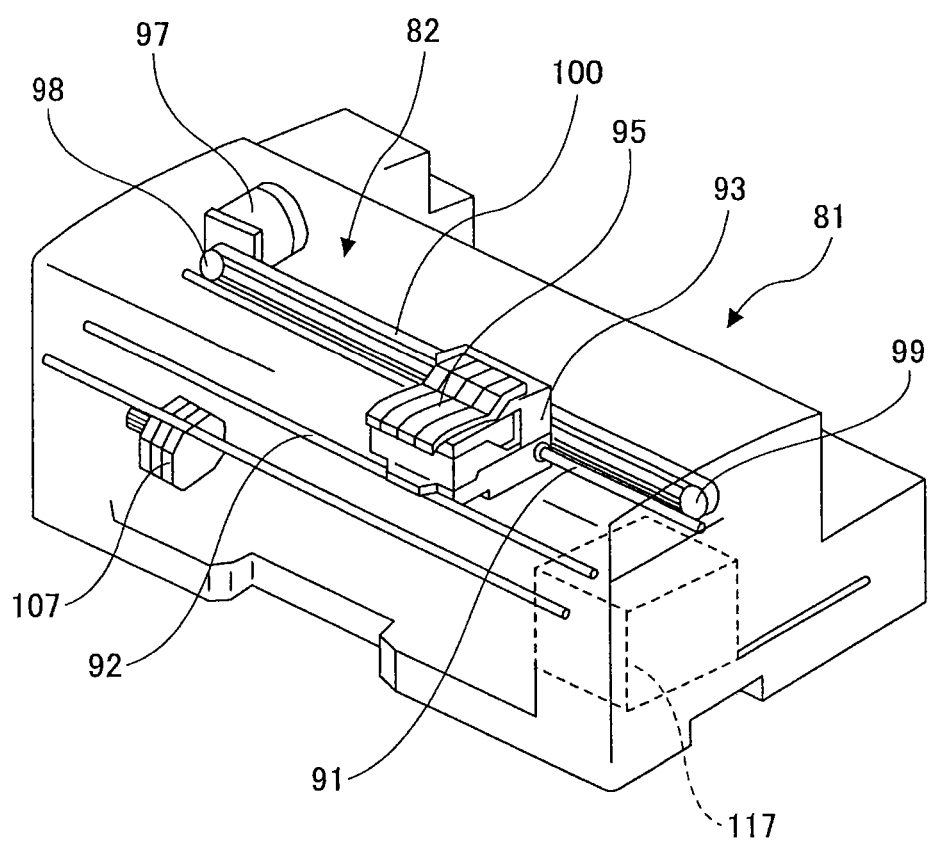
FIG. 18 is a perspective view schematically illustrating a liquid droplet discharge device according to an embodiment.
Figure 19:
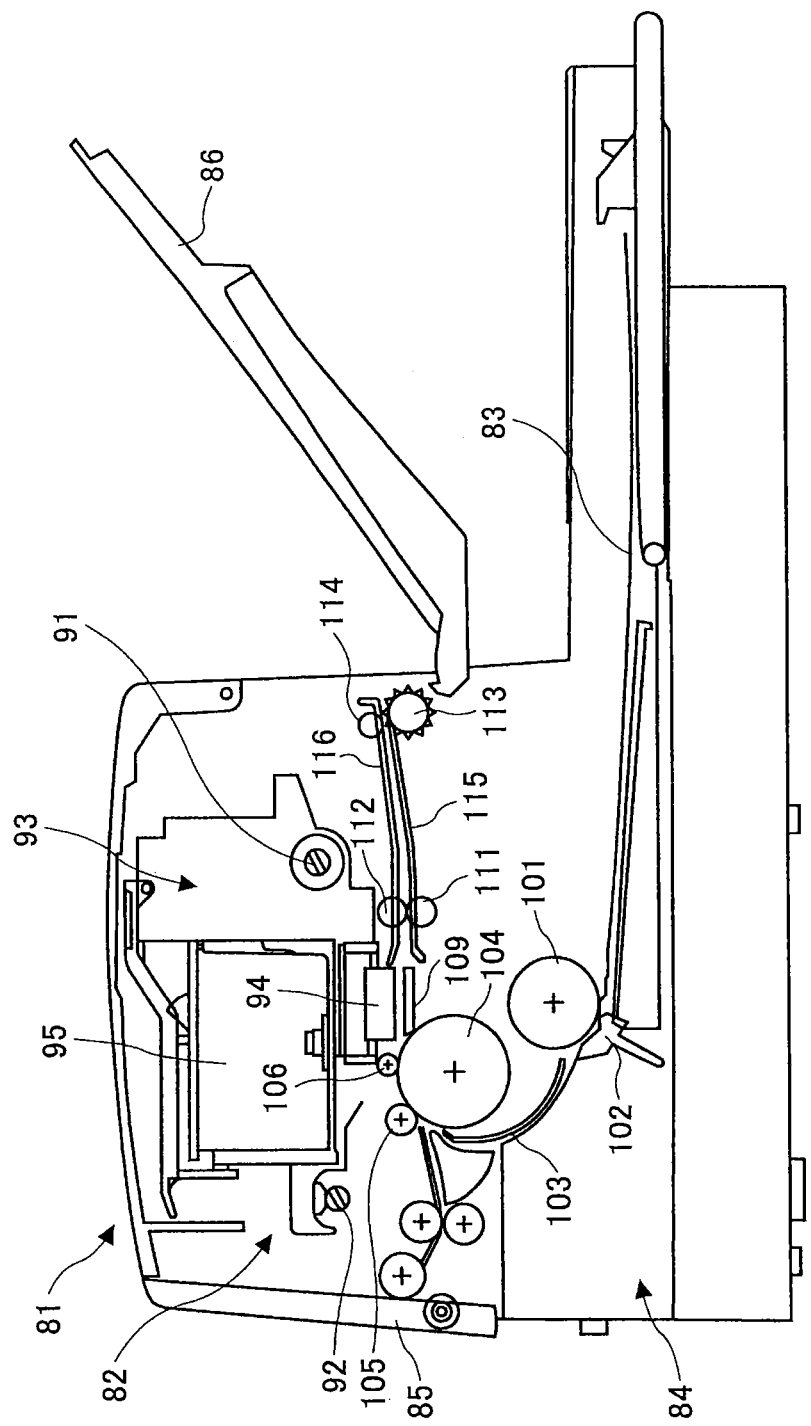
FIG. 19 is a cross-sectional view schematically illustrating the liquid droplet discharge device according to the embodiment.

Further, FIG. 18 is a perspective view schematically illustrating a liquid droplet discharge device according to an embodiment. FIG. 19 is a cross-sectional view schematically illustrating the liquid droplet discharge device according to the embodiment.

The inkjet recording device includes a recording device main body 81 and a printing mechanical section 82, etc., which are housed in the recording device main body 81. The printing mechanical section 82 includes a carriage which can move in a main-scanning direction, a recording head having an inkjet head according to an embodiment mounted on the carriage, an ink cartridge for supplying ink to the recording head, etc. Further, a sheet feeding cassette (or a sheet supply tray) 84 on which a number of sheets can be stored is provided in a manner such that the sheet feeding cassette 84 is detachably attached to the lower part and the front side of the recording device main body 81. Further, a manual tray 85 can be open and set, so that a sheet 83 can be taken into the inkjet recording device from the sheet feeding cassette 84 or the manual tray 85. Then, a desired image is recorded onto the sheet 83 by the printing mechanical section 82 and the sheet 83 is discharged to a discharge tray 86 disposed on the rear surface side of the inkjet recording device.

The printing mechanical section 82 includes a main rod 91, a sub rod 92, and a carriage 93. The main rod 91 and the sub rod 92 are guide members, which are bridged between left and right side plates, slidably supporting the carriage 93 in the main-scanning direction. The carriage 93 has a recording head 94 including an inkjet head according to an embodiment that discharges yellow (Y), cyan (C), magenta (M), and black (Bk) ink droplets. The recording head 94 has plural ink discharge openings (i.e., nozzles) arranged in the direction crossing with the main-scanning direction and whose ink droplet discharge direction is directed downward. Further, in the carriage 93, yellow (Y), cyan (C), magenta (M), and black (Bk) ink cartridges 95 are replaceably mounted, which supply yellow (Y), cyan (C), magenta (M), and black (Bk) ink, respectively to the recording head 94.

The ink cartridge 95 includes an air opening in communication with air on the upper side thereof, a supply opening to supply ink to the inkjet head on the lower side thereof, and a porous body in which ink is stored, so that a slight negative pressure is kept in the ink to be supplied to the inkjet head by the capillary force of the porous body. Here, a case is described where recording heads 94 for the respective colors are provided as a recording head. However, a single head that has nozzles to discharge ink droplets of the respective colors may be used.

Here, the carriage 93 is slidably engaged with the main rod 91 on the rear side (downstream side in the sheet feed direction) and is slidably mounted on the sub rod 92 on the front side (upstream side in the sheet feed direction). Further, in order to move the carriage 93 to scan in the main-scanning direction, a timing belt 100 is bridged between a drive pulley 98, which is rotationally driven by a main scanning motor 97, and a driven pulley 99. The timing belt 100 is fixed to the carriage 93, so that the carriage 93 is driven back and forth in accordance with forward and backward rotation of the main scanning motor 97.

On the other hand, in order to feed the sheet 83 set in the sheet feeding cassette 84 to the lower side of the recording head 94, there are a sheet feed roller 101 and a friction pad 102 to separate and feed the sheet 83 from the sheet feeding cassette 84, a guide member 103 to guide the sheet 83, a feed roller 104 to invert the fed sheet 83 and further feed the inverted sheet 83, a feed roller 105 to be pressed to the periphery surface of the feed roller 104, and a head roller 106 to define the feed angle for the sheet 83 from the feed roller 104. The feed roller 104 is driven to rotate by a sub-scanning motor 107 via a gear train.

Then, there is provided a print receive member 109 which is a sheet guide member to guide the sheet 83 fed from the feed roller 104 to the lower side of the recording head 94 in accordance with the moving range of the carriage 93 in the main-scanning direction. On the downstream side of the print receive member 109 in the sheet feed direction, there are provided a feeding roller 111 which is rotatably driven to feed the sheet 83 to the sheet discharge direction and a spur roller 112. Further, there are provided a sheet discharge roller 113 and a spur roller 114 to feed the sheet 83 to the discharge tray 86 and guide members 115 and 116 to form the sheet discharge path.

In recording, while the carriage 93 is moved and the recording head 94 is driven in accordance with the image signal, ink is discharged onto the sheet 83 which is stopped to record one line. After moving the sheet 83 by a predetermined feed distance, the next line is recorded on the sheet 83. When a record end signal or a signal indicating that the tail end of the sheet 83 reaches the recording area is received, the recording operation is terminated and the sheet 83 is discharged.

Further, there is disposed a recovery device 117 to recover from a discharge failure of the recording head 94. The recovery device 117 includes a capping means, a suction means, and a cleaning means. In a print waiting period, the carriage 93 is moved on the recovery device 117 side, so that the carriage 93 is capped to keep the discharge openings under moisture conditions to prevent an ink discharge failure due to ink drying. Further, during printing, ink irrelevant to printing is discharged so that the ink viscosity is to be constant throughout all the discharge openings to maintain a stable discharge performance.

In case of a discharge failure, the discharge openings (nozzles) of the recording head 94 are sealed by the capping means, ink and bubbles and the like are suctioned though a tube by the suction means, and ink, dust and the like are removed by the cleaning means, so as to recover from the discharge failure. Further, the suctioned ink is discharged to a waste ink reservoir (not shown) disposed on the lower side of the recording device main body 81 and absorbed and stored into an ink absorber in the waste ink reservoir.

In the following, an embodiment of the preset invention is described.

Embodiment 1

A thermally-oxidized membrane (membrane thickness: 1 μm) was formed on a 6 inch silicon wafer, and a titanium membrane (membrane thickness: 30 nm) was formed as an adhesive layer of the first electrode at the membrane forming temperature of 350° C. with a sputtering device. Then, the titanium membrane was thermally-oxidized at the temperature of 750° C. with RTA.

Then, a platinum membrane (membrane thickness: 100 nm) was formed as a metal electrode membrane at the membrane forming temperature of 350° C. with a sputtering device, and an SrRuO membrane (membrane thickness: 50 nm) was formed as an oxide electrode membrane by a sputtering membrane forming operation. The substrate heat temperature in the SrRuO sputtering membrane forming operation was 450° C. After that, a post anneal process (550° C.) was performed using the RTA. Next, a membrane was formed as an electromechanical transducer membrane by preparing a solution where Pb:Zr:Ti=115:53:47 is satisfied and performing a spin coating method.

Here, as the sputtering device, a sputtering device in which one chamber is equipped with plural targets was used to form the membrane.

In specific combining for a precursor application liquid, lead acetate trihydrate, isopropoxide titanium, and isopropoxide zirconium were used as the starting materials. The crystal water of the lead acetate was dissolved in methoxy ethanol and then dehydrated. A lead amount was excessive relative to the stoichiometric composition. This is because of the prevention of the reduction of the crystallinity due to a so-called lead removal phenomenon during heating. Isopropoxide titanium and isopropoxide zirconium were dissolved in methoxy ethanol, and an alcohol exchange reaction and an esterification reaction were proceeded with, and mixed with the methoxy ethanol in which lead acetate was dissolved to prepare PZT precursor solution. The PZT concentration was arranged to be 0.5 mol/l. By using the solution, a membrane was formed. After that, the membrane was dried at the temperature of 120° C. and then thermally-decomposed at the temperature of 500° C. After the thermal decomposition treatment was performed on the third layer, a crystallization heat treatment (at the temperature of 750° C.) was performed by a Rapid Thermal Annealing (RTA) process. At that time, the membrane thickness of the PZT was 240 nm. This process was conducted eight cycles (24 layers) to form a PZT membrane having the membrane thickness of approximately 2 μm.

Next, a SrRuO membrane (membrane thickness: 40 nm) as an oxide electrode membrane of the second electrode 405 and a Pt membrane (membrane thickness: 125 nm) as a metal electrode membrane were formed by a sputtering method. After that, a photoresist (TSMR8800) produced by Tokyo Ohka-sha was formed by a spin coating method, a resist pattern was formed by usual photolithography, and a pattern was formed by using an ICP etching device (produced by SAMCO). Next, an $Al_2O_3$ membrane (membrane thickness: 50 nm) as the first insulation protection membrane 406 was formed by an ALD method. When the film was formed, Al and $O_3$ were alternately laminated using Al which was based on TMA (Signaldrich Com.) and $O_3$ which was generated by an ozone generator. After that, a contact hole section was formed by etching. Then, as the third electrode 407, the fourth electrode 408, and the fifth electrode 410, Al was sputter deposited, patterning was formed by etching, and Si3N4 (500 nm) was deposited by a plasma CVD method to form the electromechanical transducer element.

The structure as illustrated in FIG. 8 was formed.

After that, a polarization process was performed by a corona charging process. To perform the corona charging process, a tungsten wire having a diameter (ϕ) of 50 μm was used. The polarization process conditions were: a processing temperature 80° C., a corona voltage 9 kV, a grid voltage 2.5 kV, a distance between corona electrode and grid electrode 4 mm, and a distance between grid electrode and stage 4 mm.

Further, as illustrated in FIG. 9, the electromechanical transducer element was formed under the conditions that the distance between the fifth electrode 410 and the individual electrode pads 411c disposed at the edge part, the width of the fifth electrode 410, and the width of the opening of the fifth electrode 410 were 25 μm, 25 μm, and 15 μm, respectively.

Embodiment 2

An electromechanical transducer element similar to the electromechanical transducer element in the embodiment 1 was formed except that the distance between the fifth electrode 410 and the individual electrode pads 411c disposed at the edge part, the width of the fifth electrode 410, and the width of the opening of the fifth electrode 410 as illustrated in FIG. 9 were 15 μm, 20 μm, and 10 μm, respectively.

Embodiment 3

An electromechanical transducer element similar to the electromechanical transducer element in the embodiment 1 was formed except that the distance between the fifth electrode 410 and the individual electrode pads 411c disposed at the edge part, the width of the fifth electrode 410, and the width of the opening of the fifth electrode 410 as illustrated in FIG. 9 were 50 μm, 20 μm, and 10 μm, respectively.

Embodiment 4

An electromechanical transducer element similar to the electromechanical transducer element in the embodiment 1 was formed except that the distance between the fifth electrode 410 and the individual electrode pads 411c disposed at the edge part, the width of the fifth electrode 410, and the width of the opening of the fifth electrode 410 as illustrated in FIG. 9 were 5 μm, 20 μm, and 10 μm, respectively.

Embodiment 5

An electromechanical transducer element similar to the electromechanical transducer element in the embodiment 1 was formed except that the formed structure was that described in FIG. 10.

Embodiment 6

An electromechanical transducer element similar to the electromechanical transducer element in the embodiment 1 was formed except that the formed structure was that described in FIG. 11. Further, the sixth electrode 413 was formed in the same manner as the method of forming the first electrode 403.

Comparative Example 1

An electromechanical transducer element similar to the electromechanical transducer element in the embodiment 1 was formed except that the formed structure was that described in FIGS. 5A through 5C.

Reference Example 1

An electromechanical transducer element similar to the electromechanical transducer element in the embodiment 1 was formed except that the distance between the fifth electrode 410 and the individual electrode pads 411c disposed at the edge part, the width of the fifth electrode 410, and the width of the opening of the fifth electrode 410 as illustrated in FIG. 9 were 60 µm, 10 µm, and 5 µm, respectively.

Reference Example 2

An electromechanical transducer element similar to the electromechanical transducer element in the embodiment 1 was formed except that the distance between the fifth electrode 410 and the individual electrode pads 411c disposed at the edge part, the width of the fifth electrode 410, and the width of the opening of the fifth electrode 410 as illustrated in FIG. 9 were 3 µm, 10 µm, and 5 µm, respectively.

Embodiment 7

An electromechanical transducer element similar to the electromechanical transducer element in the embodiment 1 was formed except that the layout position of the fifth electrode 410 relative to the individual electrode pad 411c disposed at one end part is changed to the layout position of the fifth electrode 410 relative to the separated individual electrode pad 411d. Namely, the formed structure was that described in FIGS. 23A and 23B, and the distance between the fifth electrode 410 and the separated individual electrode pad 411d, the width of the fifth electrode 410, and the width of the opening of the fifth electrode 410 as illustrated in FIG. 24 were 25 µm, 25 µm, and 15 µm, respectively.

Embodiment 8

An electromechanical transducer element similar to the electromechanical transducer element in the embodiment 2 was formed except that the layout position of the fifth electrode 410 relative to the individual electrode pad 411c disposed at one end part is changed to the layout position of the fifth electrode 410 relative to the separated individual electrode pad 411d. Namely, the formed structure was that described in FIGS. 23A and 23B, and the distance between the fifth electrode 410 and the separated individual electrode pad 411d, the width of the fifth electrode 410, and the width of the opening of the fifth electrode 410 as illustrated in FIG. 24 were 15 µm, 20 µm, and 10 µm, respectively.

Embodiment 9

An electromechanical transducer element similar to the electromechanical transducer element in the embodiment 3 was formed except that the layout position of the fifth electrode 410 relative to the individual electrode pad 411c disposed at one end part is changed to the layout position of the fifth electrode 410 relative to the separated individual electrode pad 411d. Namely, the formed structure was that described in FIGS. 23A and 23B, and the distance between the fifth electrode 410 and the separated individual electrode pad 411d, the width of the fifth electrode 410, and the width of the opening of the fifth electrode 410 as illustrated in FIG. 24 were 50 µm, 20 µm, and 10 µm, respectively.

Embodiment 10

An electromechanical transducer element similar to the electromechanical transducer element in the embodiment 4 was formed except that the layout position of the fifth electrode 410 relative to the individual electrode pad 411c disposed at one end part is changed to the layout position of the fifth electrode 410 relative to the separated individual electrode pad 411d. Namely, the formed structure was that described in FIGS. 23A and 23B, and the distance between the fifth electrode 410 and the separated individual electrode pad 411d, the width of the fifth electrode 410, and the width of the opening of the fifth electrode 410 as illustrated in FIG. 24 were 5 µm, 20 µm, and 10 µm, respectively.

Embodiment 11

An electromechanical transducer element similar to the electromechanical transducer element in the embodiment 5 was formed except that the layout position of the fifth electrode 410 relative to the individual electrode pad 411c disposed at one end part is changed to the layout position of the fifth electrode 410 relative to the separated individual electrode pad 411d. Namely, the formed structure was that described in FIGS. 23A and 23B, and the distance between the fifth electrode 410 and the separated individual electrode pad 411d, the width of the fifth electrode 410, and the width of the opening of the fifth electrode 410 as illustrated in FIG. 24 were 25 µm, 25 µm, and 15 µm, respectively.

Embodiment 12

An electromechanical transducer element similar to the electromechanical transducer element in the embodiment 6 was formed except that the layout position of the fifth electrode 410 relative to the individual electrode pad 411c disposed at one end part is changed to the layout position of the fifth electrode 410 relative to the separated individual electrode pad 411d. Namely, the formed structure was that described in FIGS. 23A and 23B, and the distance between the fifth electrode 410 and the separated individual electrode pad 411d, the width of the fifth electrode 410, and the width of the opening of the fifth electrode 410 as illustrated in FIG. 24 were 25 µm, 25 µm, and 15 µm, respectively.

Comparative Example 2

An electromechanical transducer element similar to the electromechanical transducer element in the embodiment 7 was formed except that the formed structure was that described in FIGS. 22A through 22C.

Reference Example 3

An electromechanical transducer element similar to the electromechanical transducer element in the embodiment 7 was formed except that the distance between the fifth electrode 410 and the separated individual electrode pad 411d, the width of the fifth electrode 410, and the width of the opening of the fifth electrode 410 as illustrated in FIG. 24 were 60 µm, 10 µm, and 5 µm, respectively.

Reference Example 4

An electromechanical transducer element similar to the electromechanical transducer element in the embodiment 7 was formed except that the distance between the fifth electrode 410 and the separated individual electrode pad 411*d*, the width of the fifth electrode 410, and the width of the opening of the fifth electrode 410 as illustrated in FIG. 24 were 3 μm, 10 μm, and 5 μm, respectively.

Figure 16:
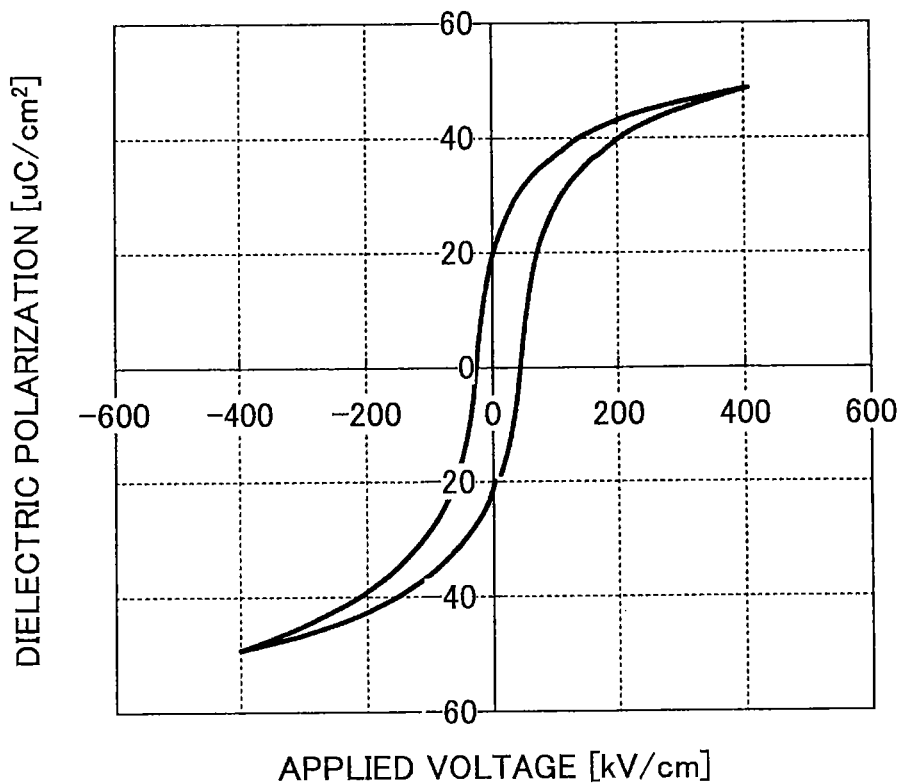
FIG. 16 illustrates a typical P-E hysteresis loop.

After the polarization process was performed on the electromechanical transducer element according to the embodiments 1 through 12, the comparative examples 1 and 2, and the reference examples 1 through 4, it was determined whether there existed any poor appearance such as, for example, a discharge mark on Bit at the individual electrode pad 411*c* disposed at one end part or the separated individual electrode pad 411*d*. Also, the electrical characteristics (polarizability), the electromechanical transducer performance (piezoelectric constant), of the formed electromechanical transducer elements were evaluated. FIG. 16 illustrates a typical P-E hysteresis curve. The electromechanical transducer performance was calculated by combining a measurement result of a displacement amount using a laser Doppler vibration meter while an electric field (150 kV/cm) was applied and the simulation thereof. After evaluating the initial characteristics, the durability (i.e., characteristics right after the voltage was applied $10^{10}$ cycles) was evaluated. Details of those results are described in Tables 1 and 2.

TABLE 1

| | WIRING STRUCTURE | DISTANCE BETWEEN FIFTH ELECTRODE AND INDIVIDUAL ELECTRODE PAD AT END PART | WIDTH OF FIFTH ELECTRODE | WIDTH OF OPENING OF FIFTH ELECTRODE | DISCHARGE MARK (END PART) | POLARIZATION (END PART) | ELECTROMECHANICAL TRANSDUCER PERFORMANCE (END PART) | |
|---|---|---|---|---|---|---|---|---|
| | | | | | | | INITIAL | AFTER 1E10 CYCLES |
| EMBODIMENT 1 | FIG. 8 | 25 μm | 25 μm | 15 μm | NOT OCCURRED | 3 μC/cm$^2$ | 133 pm/V | 130 pm/V |
| EMBODIMENT 2 | FIG. 8 | 15 μm | 20 μm | 10 μm | NOT OCCURRED | 3 μC/cm$^2$ | 137 pm/V | 133 pm/V |
| EMBODIMENT 3 | FIG. 8 | 50 μm | 20 μm | 10 μm | NOT OCCURRED | 3 μC/cm$^2$ | 139 pm/V | 137 pm/V |
| EMBODIMENT 4 | FIG. 8 | 5 μm | 20 μm | 10 μm | NOT OCCURRED | 5 μC/cm$^2$ | 132 pm/V | 125 pm/V |
| EMBODIMENT 5 | FIG. 10 | 25 μm | 25 μm | 15 μm | NOT OCCURRED | 3 μC/cm$^2$ | 133 pm/V | 130 pm/V |
| EMBODIMENT 6 | FIG. 11 | 25 μm | 25 μm | 15 μm | NOT OCCURRED | 3 μC/cm$^2$ | 134 pm/V | 132 pm/V |
| COMPARATIVE EXAMPLE 1 | FIG. 5 | — | — | — | OCCURRED | — | — | — |
| REFERENCE EXAMPLE 1 | FIG. 8 | 60 μm | 10 μm | 5 μm | OCCURRED | — | — | — |
| REFERENCE EXAMPLE 2 | FIG. 8 | 3 μm | 10 μm | 5 μm | NOT OCCURRED | 15 μC/cm$^2$ | 136 pm/V | 115 pm/V |

TABLE 2

| | WIRING STRUCTURE | DISTANCE BETWEEN FIFTH ELECTRODE AND INDIVIDUAL ELECTRODE PAD AT END PART | WIDTH OF FIFTH ELECTRODE | WIDTH OF OPENING OF FIFTH ELECTRODE | DISCHARGE MARK (SEPARATED PART) | POLARIZATION (SEPARATED PART) | ELECTROMECHANICAL TRANSDUCER PERFORMANCE (SEPARATED PART) | |
|---|---|---|---|---|---|---|---|---|
| | | | | | | | INITIAL | AFTER 1E10 CYCLES |
| EMBODIMENT 7 | FIG. 23 | 25 μm | 25 μm | 15 μm | NOT OCCURRED | 3 μC/cm$^2$ | 133 pm/V | 130 pm/V |
| EMBODIMENT 8 | FIG. 23 | 15 μm | 20 μm | 10 μm | NOT OCCURRED | 3 μC/cm$^2$ | 137 pm/V | 133 pm/V |
| EMBODIMENT 9 | FIG. 23 | 50 μm | 20 μm | 10 μm | NOT OCCURRED | 3 μC/cm$^2$ | 139 pm/V | 137 pm/V |
| EMBODIMENT 10 | FIG. 23 | 5 μm | 20 μm | 10 μm | NOT OCCURRED | 5 μC/cm$^2$ | 132 pm/V | 125 pm/V |
| EMBODIMENT 11 | FIG. 25 | 25 μm | 25 μm | 15 μm | NOT OCCURRED | 3 μC/cm$^2$ | 133 pm/V | 130 pm/V |
| EMBODIMENT 12 | FIG. 26 | 25 μm | 25 μm | 15 μm | NOT OCCURRED | 3 μC/cm$^2$ | 134 pm/V | 132 pm/V |
| COMPARATIVE EXAMPLE 2 | — | — | — | — | OCCURRED | — | — | — |
| REFERENCE EXAMPLE 3 | FIG. 23 | 60 μm | 10 μm | 5 μm | OCCURRED | — | — | — |
| REFERENCE EXAMPLE 4 | FIG. 23 | 3 μm | 10 μm | 5 μm | NOT OCCURRED | 15 μC/cm$^2$ | 136 pm/V | 115 pm/V |

The formed electromechanical transducer elements according to embodiments 1 through 12 had the characteristics same as the characteristics of general ceramic sintered bodies (i.e., the piezoelectric constant was in a range of −120 pm/V to −160 pm/V).

On the other hand, in the formed electromechanical transducer elements according to comparative examples 1 and 2 and reference examples 1 and 3, a discharge mark was observed after the polarization process, so that no electrical characteristics can be evaluated after the polarization process. In the formed electromechanical transducer elements according to reference examples 2 and 4, it was observed that the polarizability was high and the piezoelectric constant was remarkably degraded in a result of the durability test as well.

Further, in the formed electromechanical transducer elements according to reference examples 1 through 4, all the values indicating the distance between the fifth electrode 410 and the individual electrode pads 411c disposed at the edge part or the separated individual electrode pad 411d, the width of the fifth electrode 410, and the width of the opening of the fifth electrode 410 are out of the respective preferable ranges. Therefore, it is not possible to obtain an effect of the present invention. However, it should be noted that in order to obtain an effect of the present invention, it is not always necessary that all the values indicating the distance between the fifth electrode 410 and the individual electrode pads 411c disposed at the edge part or the separated individual electrode pad 411d, the width of the fifth electrode 410, and the width of the opening of the fifth electrode 410 are in the respective preferable ranges. For example, in place of the above condition, it becomes possible to obtain a desired effect of the present invention by using another configuration.

By using the formed electromechanical transducer elements according to embodiments 1 through 12, the liquid droplet discharge heads of FIG. 17 were formed, and the liquid discharge characteristics were evaluated. By using ink whose viscosity was adjusted to 5 cp, the discharge characteristics were evaluated while a voltage in a range of −10 V to −30V using a simple Push waveform was applied. As a result, it was observed that ink was discharged from all the nozzles.

As described above, the inkjet recording device includes one of the inkjet heads (liquid droplet discharge device) according to the embodiments 1 through 12. Therefore, it becomes possible to obtain stable ink droplet discharge characteristics without an ink droplet discharge failure due to a vibration plate drive failure, thereby improving the image quality.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An electromechanical transducer element comprising:
   a substrate;
   a first electrode formed on the substrate and configured to serve as a common electrode;
   an electromechanical transducer membrane formed on the first electrode;
   a second electrode formed on the electromechanical transducer membrane and configured to serve as an individual electrode;
   a first insulation protection membrane formed on the first electrode and the second electrode and having plural contact holes;
   a third electrode formed so as to be electrically connected to the first electrode through one of the contact holes;
   a fourth electrode formed so as to be electrically connected to the second electrode through one of the contact holes;
   a second insulation protection membrane including a common electrode pad formed on the third electrode and plural individual electrode pads formed on the fourth electrode and in a predetermined line; and
   a fifth electrode formed so as to surround a vicinity of at least one of the individual electrode pads disposed at end parts in the predetermined line,
   wherein the fifth electrode is formed on the first insulation protection membrane and is electrically connected to the first electrode through one of the contact holes.

2. The electromechanical transducer element according to claim 1, further comprising:
   a sixth electrode formed so as to be electrically connected to the fifth electrode through one of the contact holes,
   wherein the fifth electrode is formed on the first insulation protection membrane and the sixth electrode is independently formed on the substrate from the first electrode.

3. An electromechanical transducer element comprising:
   a substrate;
   a first electrode formed on the substrate and configured to serve as a common electrode;
   an electromechanical transducer membrane formed on the first electrode;
   a second electrode formed on the electromechanical transducer membrane and configured to serve as an individual electrode;
   a first insulation protection membrane formed on the first electrode and the second electrode and having plural contact holes;
   a third electrode formed so as to be electrically connected to the first electrode through one of the contact holes;
   a fourth electrode formed so as to be electrically connected to the second electrode through one of the contact holes;
   a second insulation protection membrane including a common electrode pad formed on the third electrode and plural individual electrode pads formed on the fourth electrode and in a predetermined line; and
   a fifth electrode formed so as to surround a vicinity of one of separated individual electrode pads which are separated from each other by a distance greater than a distance between adjacent individual electrode pads except for the separated individual electrode pads in the predetermined line,
   wherein the fifth electrode is formed on the first insulation protection membrane and is electrically connected to the first electrode through one of the contact holes.

4. The electromechanical transducer element according to claim 3, further comprising:
   a sixth electrode formed so as to be electrically connected to the fifth electrode through one of the contact holes,
   wherein the fifth electrode is formed on the first insulation protection membrane and the sixth electrode is independently formed on the substrate from the first electrode.

5. The electromechanical transducer element according to claim 1,
   wherein the second insulation protection membrane is formed on the fifth electrode and has an opening formed so as to surround the vicinity of at least one of the individual electrode pads disposed at end parts in the predetermined line.

6. The electromechanical transducer element according to claim 1,
wherein the fifth electrode has an L-shape.

7. The electromechanical transducer element according to claim 1,
wherein the second insulation protection membrane formed on the fifth electrode has an opening having an L-shape formed so as to surround the vicinity of at least one of the individual electrode pads disposed at end parts in the predetermined line.

8. The electromechanical transducer element according to claim 1,
wherein the fifth electrode is configured to be electrically connected to the third electrode.

9. The electromechanical transducer element according to claim 1,
wherein a distance between the fifth electrode and the individual electrode pad disposed at the end part is greater than or equal to 3 μm and less than or equal to 50 μm.

10. The electromechanical transducer element according to claim 1,
wherein a distance between the opening formed in the second insulation protection membrane on the fifth electrode and surrounding the vicinity of the at least one of the individual electrode pads disposed at end parts in the predetermined line and the at least one of the individual electrode pads disposed at end parts is greater than or equal to 5 μm and less than or equal to 50 μm.

11. The electromechanical transducer element according to claim 1,
wherein a width of the fifth electrode is greater than or equal to 20 μm.

12. The electromechanical transducer element according to claim 1,
wherein a width of the opening formed in the second insulation protection membrane on the fifth electrode and surrounding the vicinity of the at least one of the individual electrode pads disposed at end parts in the predetermined line is greater than or equal to 10 μm.

13. The electromechanical transducer element according to claim 1,
wherein a leak current amount is less than or equal to $1.0 \times 10^{-8}$ A when a voltage 50 V is applied between the first electrode and the second electrode.

14. The electromechanical transducer element according to claim 1,
wherein an insulation resistance of the electromechanical transducer membrane is greater than or equal to $5.0 \times 10^{10} \Omega$.

15. The electromechanical transducer element according to claim 1,
wherein a leak current amount is less than or equal to $1.0 \times 10^{-8}$ A when a voltage 50 V is applied between the individual electrode pads.

16. The electromechanical transducer element according to claim 1,
wherein the second insulation protection membrane has openings to expose the common electrode pad and the individual electrode pads.

17. A method of forming an electromechanical transducer element, comprising:
a charge generation step of generating positively charged charges whose charge amount is greater than or equal to $1.0 \times 10^8$ C by corona discharge or glow discharge; and
a polarization step of performing a polarization process on the electromechanical transducer membrane via the first electrode and the second electrode of the electromechanical transducer element according to claim 1.

18. The method of forming an electromechanical transducer element according to claim 17,
wherein, in the polarization step, a hysteresis loop is measured by applying electric field intensity of $\pm 150$ kV/cm, and when a value of (Pr-Pini) is defined as polarizability, where "Pr" denotes the polarization upon the initial voltage of 0 kV/cm, and "Pini" denotes the polarization when the voltage is 0 kV/cm after the voltage of +150 kV/cm is applied and the voltage is returned to 0 kV/cm, the polarizability (Pr-Pini) is less than or equal to 10 μC/cm$^2$.

19. A liquid droplet discharge head comprising:
a nozzle to discharge liquid droplets;
a compression chamber in communication with the nozzle; and
a discharge drive unit configured to increase a pressure of liquid in the compression chamber,
wherein the discharge drive unit includes a vibration plate as a part of walls of the compression chamber, and
wherein the electromechanical transducer element according to claim 1 is disposed in the vibration plate.

20. A liquid droplet discharge device comprising:
the liquid droplet discharge head according to claim 19.

* * * * *